United States Patent
Schmitt

(10) Patent No.: US 10,697,800 B2
(45) Date of Patent: Jun. 30, 2020

(54) MULTI-DIMENSIONAL MEASUREMENT USING MAGNETIC SENSORS AND RELATED SYSTEMS, METHODS, AND INTEGRATED CIRCUITS

(71) Applicant: Analog Devices Global, Hamilton (BM)

(72) Inventor: Jochen Schmitt, Biedenkopf (DE)

(73) Assignee: Analog Devices Global, Hamilton (BM)

( * ) Notice: Subject to any disclaimer, the term of this patent is extended or adjusted under 35 U.S.C. 154(b) by 50 days.

(21) Appl. No.: 15/682,966

(22) Filed: Aug. 22, 2017

(65) Prior Publication Data

US 2018/0128648 A1    May 10, 2018

Related U.S. Application Data

(60) Provisional application No. 62/417,968, filed on Nov. 4, 2016.

(51) Int. Cl.
*G01D 5/165* (2006.01)
*G01R 33/09* (2006.01)
*G01D 5/14* (2006.01)

(52) U.S. Cl.
CPC ........... *G01D 5/1655* (2013.01); *G01D 5/145* (2013.01); *G01R 33/096* (2013.01)

(58) Field of Classification Search
CPC ...... G01R 33/06; G01R 33/09; G01R 33/096; G01R 33/093; G01R 33/098; G01R 33/0005; G01R 33/02
USPC ............................... 324/207.13, 207.21, 252
See application file for complete search history.

(56) References Cited

U.S. PATENT DOCUMENTS

| | | |
|---|---|---|
| 3,724,274 A | 4/1973 | Millar |
| 3,949,274 A | 4/1976 | Anacker |
| 4,006,394 A * | 2/1977 | Cuda ...................... G05B 19/39 360/78.04 |
| 4,742,183 A | 5/1988 | Soloway et al. |
| 4,928,206 A | 5/1990 | Porter et al. |
| 5,126,286 A | 6/1992 | Chance |
| 5,289,122 A * | 2/1994 | Shigeno ................ G06K 7/084 209/534 |
| 5,405,337 A | 4/1995 | Maynard |
| 5,452,182 A | 9/1995 | Eichelberger et al. |

(Continued)

FOREIGN PATENT DOCUMENTS

| | | |
|---|---|---|
| CN | 102129053 | 7/2011 |
| CN | 202393897 | 8/2012 |

(Continued)

OTHER PUBLICATIONS

WO 2016020326 A1 EPO English Translation. (Year: 2019).*

(Continued)

*Primary Examiner* — Patrick Assouad
*Assistant Examiner* — Sean Curtis
(74) *Attorney, Agent, or Firm* — Knobbe, Martens, Olson & Bear LLP

(57) ABSTRACT

This disclosure describes, among other things, embodiments of devices, systems, and methods for using 3-dimensional (3D) magnetic sensors to detect the position of a magnetic target. By using 3D magnetic sensors, a two dimensional array of such magnetic sensors can be used to determine a 3D position of a magnetic target.

20 Claims, 13 Drawing Sheets

(56) References Cited

U.S. PATENT DOCUMENTS

| | | | |
|---|---|---|---|
| 5,554,806 A | 9/1996 | Mizuno et al. | |
| 5,555,159 A | 9/1996 | Dore | |
| 5,616,863 A | 4/1997 | Koen | |
| 5,644,230 A | 7/1997 | Pant et al. | |
| 5,731,222 A | 3/1998 | Malloy et al. | |
| 5,833,608 A | 11/1998 | Acker | |
| 5,903,440 A | 5/1999 | Blazier et al. | |
| 6,040,624 A | 3/2000 | Chambers et al. | |
| 6,052,610 A * | 4/2000 | Koch | A61B 8/12 324/207.11 |
| 6,075,708 A | 6/2000 | Nakamura | |
| 6,078,102 A | 6/2000 | Crane, Jr. et al. | |
| 6,097,183 A * | 8/2000 | Goetz | G01D 5/145 324/207.12 |
| 6,106,476 A | 8/2000 | Corl et al. | |
| 6,169,254 B1 | 1/2001 | Pant et al. | |
| 6,184,680 B1 | 2/2001 | Shinoura et al. | |
| 6,225,688 B1 | 5/2001 | Kim et al. | |
| 6,278,271 B1 | 8/2001 | Schott | |
| 6,291,894 B1 | 9/2001 | Farnworth et al. | |
| 6,304,082 B1 * | 10/2001 | Gualtieri | B82Y 25/00 324/247 |
| 6,326,908 B1 * | 12/2001 | Hoffman | H03M 1/1042 341/111 |
| 6,339,191 B1 | 1/2002 | Crane, Jr. et al. | |
| 6,348,427 B1 | 2/2002 | Hamada et al. | |
| 6,511,863 B2 | 1/2003 | Farnworth et al. | |
| 6,536,123 B2 | 3/2003 | Tamura | |
| 6,570,246 B1 | 5/2003 | Lee et al. | |
| 6,591,492 B2 | 7/2003 | Farrar | |
| 6,705,005 B1 | 3/2004 | Blazier et al. | |
| 6,721,189 B1 | 4/2004 | Haba | |
| 6,777,261 B2 | 8/2004 | Farnworth et al. | |
| 6,784,659 B2 * | 8/2004 | Haji-Sheikh | G01D 5/145 324/174 |
| 6,852,607 B2 | 2/2005 | Song et al. | |
| 6,903,465 B2 | 6/2005 | Farnworth et al. | |
| 6,993,443 B2 * | 1/2006 | Harle | G01B 7/004 324/207.11 |
| 6,993,974 B2 | 2/2006 | Tenerz et al. | |
| 7,012,812 B2 | 3/2006 | Haba | |
| 7,115,984 B2 | 10/2006 | Poo et al. | |
| 7,202,552 B2 | 4/2007 | Zhe et al. | |
| 7,211,886 B2 | 5/2007 | Hsu et al. | |
| 7,265,719 B1 | 9/2007 | Moosbrugger et al. | |
| 7,301,332 B2 | 11/2007 | Govari et al. | |
| 7,307,415 B2 * | 12/2007 | Seger | G01D 5/04 324/207.2 |
| 7,375,009 B2 | 5/2008 | Chua et al. | |
| 7,408,342 B2 * | 8/2008 | Desplats | G01R 33/02 324/247 |
| 7,408,343 B2 * | 8/2008 | Dmytriw | G01R 33/09 324/252 |
| 7,420,262 B2 | 9/2008 | Bauer et al. | |
| 7,429,788 B2 | 9/2008 | Clayton et al. | |
| 7,467,552 B2 | 12/2008 | MacGugan | |
| 7,525,309 B2 | 4/2009 | Sherman et al. | |
| 7,812,596 B2 | 10/2010 | Potter et al. | |
| 7,839,657 B2 | 11/2010 | Nodine | |
| 8,018,223 B2 * | 9/2011 | Latoria | G01D 5/145 324/207.25 |
| 8,115,480 B2 * | 2/2012 | Masubuchi | G01V 3/08 324/227 |
| 8,134,361 B2 * | 3/2012 | Azumi | B82Y 25/00 324/207.21 |
| 8,148,978 B2 | 4/2012 | Sherman et al. | |
| 8,421,453 B2 * | 4/2013 | Bauer | G01R 33/093 324/252 |
| 8,692,366 B2 | 4/2014 | Xue et al. | |
| 8,750,961 B1 * | 6/2014 | Ries | A61N 1/3718 600/407 |
| 8,786,278 B2 * | 7/2014 | Ohta | G01R 33/093 324/247 |
| 8,836,132 B2 | 9/2014 | Xue | |
| 8,957,679 B2 | 2/2015 | Loreit et al. | |
| 9,000,763 B2 * | 4/2015 | Ausserlechner | G01R 33/0206 324/202 |
| 9,030,194 B2 * | 5/2015 | Dolsak | G01D 5/24438 324/207.25 |
| 9,069,033 B2 | 6/2015 | Chen et al. | |
| 9,093,360 B2 | 7/2015 | Bolognia | |
| 9,103,657 B2 * | 8/2015 | Ruigrok | G01D 5/147 |
| 9,116,022 B2 | 8/2015 | Bolognia | |
| 9,234,736 B2 | 1/2016 | Engel et al. | |
| 9,268,001 B2 | 2/2016 | Ausserlechner | |
| 9,278,851 B2 | 3/2016 | Xue | |
| 9,286,924 B1 | 3/2016 | Akatsuka et al. | |
| 9,297,863 B2 | 3/2016 | Jeng et al. | |
| 9,332,940 B1 | 5/2016 | Bolognia | |
| 9,335,149 B2 * | 5/2016 | Stark | G01B 7/004 |
| 9,372,064 B2 | 6/2016 | Zwijze et al. | |
| 9,470,552 B2 | 10/2016 | Ausserlechner | |
| 9,475,694 B2 | 10/2016 | Martizon et al. | |
| 9,494,661 B2 | 11/2016 | Paul et al. | |
| 9,513,344 B2 | 12/2016 | Ausserlechner | |
| 9,601,455 B2 * | 3/2017 | Nishiyama | G01R 33/02 |
| 9,624,095 B2 | 4/2017 | Millett et al. | |
| 9,625,276 B2 | 4/2017 | Ausserlechner | |
| 9,658,298 B2 * | 5/2017 | Cai | G01R 33/0005 |
| 9,780,471 B2 * | 10/2017 | Van Rijswijk | H05K 1/11 |
| 9,877,660 B2 | 1/2018 | O'Connell et al. | |
| 9,941,237 B2 * | 4/2018 | Nishiyama | H01L 24/32 |
| 9,995,600 B2 * | 6/2018 | Nagarkar | G01D 5/16 |
| 10,081,266 B2 * | 9/2018 | Draeger | H02J 50/90 |
| 10,337,888 B2 * | 7/2019 | Jost | G01R 33/0052 |
| 2002/0005715 A1 | 1/2002 | Sato | |
| 2003/0120150 A1 | 6/2003 | Govari | |
| 2003/0209789 A1 | 11/2003 | Hanson et al. | |
| 2004/0021458 A1 | 2/2004 | Imamura | |
| 2004/0157410 A1 | 8/2004 | Yamaguchi | |
| 2004/0169244 A1 | 9/2004 | MacGugan | |
| 2005/0184187 A1 | 8/2005 | Ullman et al. | |
| 2005/0230795 A1 | 10/2005 | Furuyama et al. | |
| 2006/0082363 A1 * | 4/2006 | Ricks | G01D 3/022 324/207.21 |
| 2006/0103375 A1 | 5/2006 | Dmytriw et al. | |
| 2006/0129061 A1 | 6/2006 | Kaneto et al. | |
| 2006/0151864 A1 | 7/2006 | Anderson et al. | |
| 2006/0261453 A1 | 11/2006 | Lee et al. | |
| 2007/0035294 A1 * | 2/2007 | Peczalski | B82Y 25/00 324/252 |
| 2007/0053504 A1 | 3/2007 | Sato et al. | |
| 2008/0175425 A1 | 7/2008 | Roberts et al. | |
| 2008/0285111 A1 | 11/2008 | Ishii et al. | |
| 2009/0027048 A1 * | 1/2009 | Sato | B82Y 25/00 324/247 |
| 2009/0121342 A1 | 5/2009 | Minakawa et al. | |
| 2009/0243402 A1 * | 10/2009 | O'Day | G01D 5/244 310/12.19 |
| 2009/0268019 A1 | 10/2009 | Ishii et al. | |
| 2009/0295381 A1 * | 12/2009 | Theuss | G01R 33/0005 324/252 |
| 2009/0315554 A1 | 12/2009 | Witcraft et al. | |
| 2010/0072992 A1 * | 3/2010 | Bauer | B82Y 25/00 324/260 |
| 2010/0078739 A1 | 4/2010 | Xue et al. | |
| 2010/0090295 A1 | 4/2010 | Zhe et al. | |
| 2010/0155863 A1 | 6/2010 | Weekamp | |
| 2010/0197148 A1 | 8/2010 | Rudisill et al. | |
| 2011/0018143 A1 | 1/2011 | Chua et al. | |
| 2011/0074406 A1 * | 3/2011 | Mather | H01L 27/22 324/252 |
| 2011/0149522 A1 | 6/2011 | Johann et al. | |
| 2011/0227569 A1 * | 9/2011 | Cai | B82Y 25/00 324/252 |
| 2011/0234218 A1 * | 9/2011 | Lagouge | G01R 33/072 324/247 |
| 2011/0248706 A1 * | 10/2011 | Davis | G01B 7/003 324/207.11 |
| 2012/0217960 A1 * | 8/2012 | Ausserlechner | G01R 33/0206 324/252 |

(56) References Cited

U.S. PATENT DOCUMENTS

| | | | |
|---|---|---|---|
| 2012/0268113 A1* | 10/2012 | Sato | B82Y 25/00 324/247 |
| 2013/0023769 A1 | 1/2013 | Tsai et al. | |
| 2013/0134969 A1* | 5/2013 | Ohta | G01R 33/093 324/252 |
| 2013/0249542 A1* | 9/2013 | Zhao | G01R 33/02 324/244 |
| 2013/0313130 A1 | 11/2013 | Little et al. | |
| 2013/0320969 A1* | 12/2013 | Reichenbach | G01R 33/0052 324/247 |
| 2013/0335072 A1* | 12/2013 | Malzfeldt | G01D 5/145 324/207.21 |
| 2014/0005521 A1 | 1/2014 | Kohler et al. | |
| 2014/0197531 A1 | 7/2014 | Bolognia | |
| 2014/0266187 A1* | 9/2014 | Mather | G01R 33/096 324/252 |
| 2015/0066007 A1 | 3/2015 | Srivastava | |
| 2015/0084619 A1* | 3/2015 | Stark | G01D 5/145 324/207.2 |
| 2015/0164469 A1 | 6/2015 | Corl | |
| 2015/0204950 A1* | 7/2015 | Ausserlechner | G01R 33/0206 324/252 |
| 2015/0285611 A1* | 10/2015 | Lowery | G01C 21/00 702/150 |
| 2016/0161288 A1* | 6/2016 | Lu | H01L 21/67259 324/207.2 |
| 2016/0169985 A1* | 6/2016 | Weber | G01R 17/105 324/252 |
| 2016/0178397 A1* | 6/2016 | Jost | G01R 33/0052 324/207.12 |
| 2016/0249817 A1 | 9/2016 | Mazer et al. | |
| 2017/0014198 A1 | 1/2017 | Gravlee | |
| 2017/0108354 A1* | 4/2017 | Maiterth | G01D 5/147 |
| 2017/0136906 A1* | 5/2017 | Draeger | B60L 11/1829 |
| 2017/0164867 A1 | 6/2017 | Kassab et al. | |
| 2017/0276738 A1* | 9/2017 | Holm | G01R 33/093 |
| 2017/0356764 A1* | 12/2017 | Deak | G01R 33/09 |
| 2018/0062071 A1 | 3/2018 | Bolognia et al. | |
| 2018/0113176 A1* | 4/2018 | Nagata | G01R 33/0206 |
| 2018/0122784 A1 | 5/2018 | Bolognia | |
| 2018/0128648 A1* | 5/2018 | Schmitt | G01D 5/1655 |
| 2018/0216967 A1* | 8/2018 | Sun | G01D 5/2046 |
| 2018/0274896 A1* | 9/2018 | Anagawa | G01D 3/02 |

FOREIGN PATENT DOCUMENTS

| | | | | |
|---|---|---|---|---|
| CN | 105452812 | | 3/2016 | |
| DE | 10 2011 001 422 | | 9/2012 | |
| DE | 102017125732 A1 * | 5/2018 | | G01D 5/1655 |
| EP | 0 575 800 A2 | 12/1993 | | |
| EP | 0 783 666 | 7/1997 | | |
| EP | 1 321 743 | 6/2003 | | |
| GB | 2528251 | 1/2016 | | |
| JP | 09121015 A | 5/1997 | | |
| JP | 2002-22403 | 1/2002 | | |
| JP | 2002-529133 | 9/2002 | | |
| JP | 2008-305395 | 12/2008 | | |
| JP | 2009-289724 | 12/2009 | | |
| JP | 2011-501163 | 1/2011 | | |
| JP | 2011-220977 | 11/2011 | | |
| JP | 2016/169685 | 9/2016 | | |
| JP | 2018072344 A * | 5/2018 | | G01D 5/1655 |
| WO | WO 96/10731 | 4/1996 | | |
| WO | WO 0027281 | 5/2000 | | |
| WO | WO-0027281 A1 * | 5/2000 | | A61B 34/20 |
| WO | WO 0104656 | 1/2001 | | |
| WO | WO 2002/052221 | 12/2001 | | |
| WO | WO 2009/052537 | 4/2009 | | |
| WO | WO 2011/080935 | 7/2011 | | |
| WO | WO-2016020326 A1 * | 2/2016 | | B60L 53/36 |
| WO | WO 2016/127130 A1 | 8/2016 | | |
| WO | WO 2016/171597 A1 | 10/2016 | | |

OTHER PUBLICATIONS

Images obtained on Jun. 13, 2011 from a web search related to three-dimensional packaging.

Sensors—HARTING Mitronics, HARTING Pushing Performance, in 2 pages (downloaded from World Wide Web page: harting-mitronics.ch/en/produkte/anwendungen/sensorik/index.php on Jul. 11, 2011).

Tanase et al., "Multi-parameter sensor system with intravascular navigation for catheter/guide wire application", Sensors and Actuators A 97-98:116-124 (2002).

Office Action in Chinese Patent Application No. 201711066871.3 dated Aug. 5, 2019.

Li, "Polymer Flip-chip Bonding of Pressure Sensors on Flexible Kapton Film for Neonatal Catheters", A thesis submitted to the Division of Research and Advanced Studies of the University of Cincinnati (2004).

Office Action for Japanese Patent Application No. 2017-213599 dated Jun. 3, 2019.

Third Party Observations in German Patent Application No. 102017125732.2.

Office Action for Japanese Patent Application No. 2017-213599 dated Mar. 9, 2020.

* cited by examiner

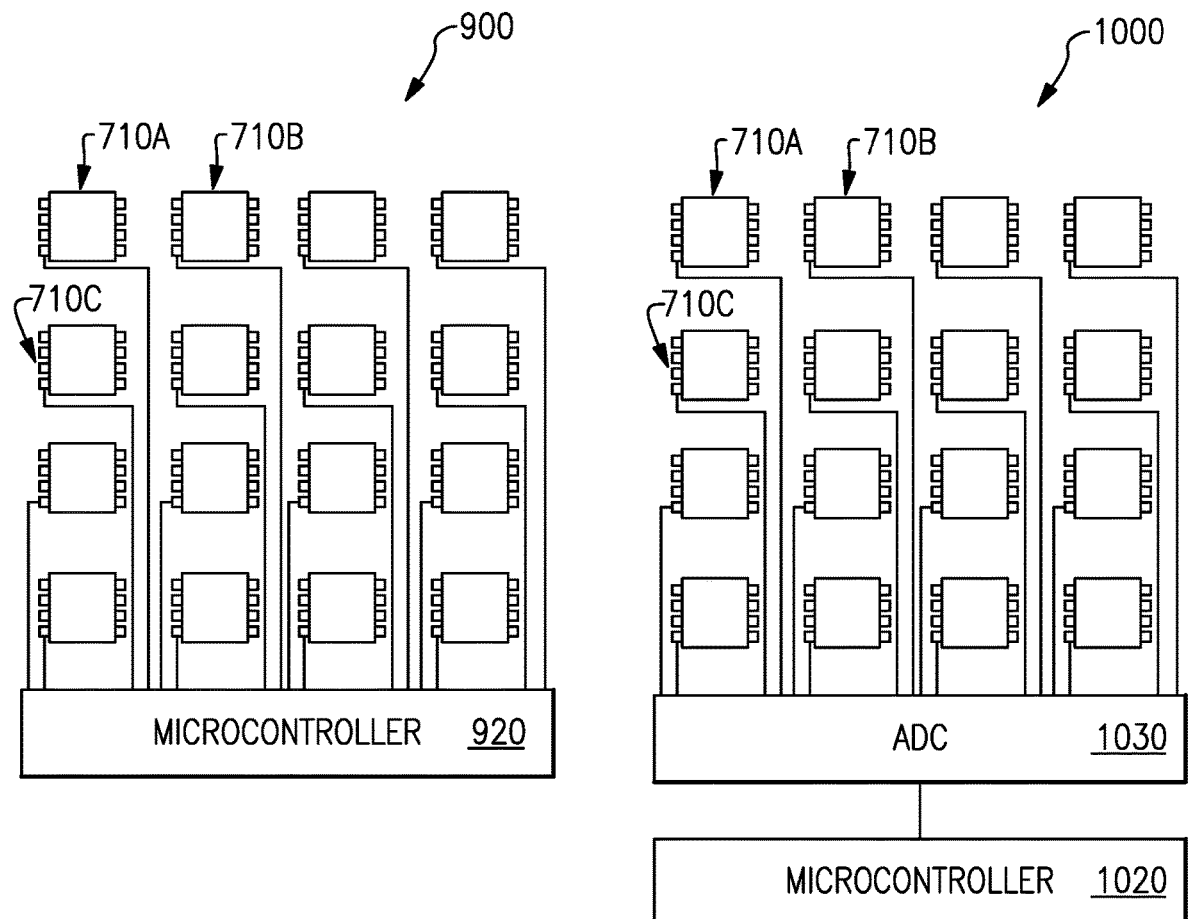

under 35 U.S.C. § 119(e) of U.S. Provisional Patent Application No. 62/417,968, filed Nov. 4, 2016, titled "THREE-DIMENSIONAL POSITION MEASUREMENT USING MAGNETIC SENSORS," the disclosure of which is hereby incorporated by reference in its entirety.

MULTI-DIMENSIONAL MEASUREMENT USING MAGNETIC SENSORS AND RELATED SYSTEMS, METHODS, AND INTEGRATED CIRCUITS

CROSS-REFERENCE TO RELATED APPLICATION

This application claims the benefit of priority under 35 U.S.C. § 119(e) of U.S. Provisional Patent Application No. 62/417,968, filed Nov. 4, 2016, titled "THREE-DIMENSIONAL POSITION MEASUREMENT USING MAGNETIC SENSORS," the disclosure of which is hereby incorporated by reference in its entirety.

FIELD OF THE DISCLOSURE

The present disclosure relates to detecting position of a magnetic target.

BACKGROUND

Various arrangements of magnetic sensors are used to measure the position of a magnet. For example, magnetic sensors can be arranged to determine a position of a magnet in one, two, or three dimensions. Example magnetic sensors include magnetoresistive sensors and Hall effect sensors.

SUMMARY OF THE DISCLOSURE

This disclosure describes, among other things, embodiments of devices, systems, and methods for using magnetic sensors (e.g., three dimensional field and/or angle sensors) to monitor the position of a magnetic target. By using a three-dimensional (3D) field or angle sensors, a two dimensional (2D) array of sensors may be used instead of a three dimensional array of sensors. As such, the 3D position of a magnetic target may be measured using fewer sensors in a 2D array compared to a 3D array.

In one aspect, the present disclosure provides a magnetic sensor for detecting a position of a magnetic target, the magnetic sensor comprising: a first magnetic sensing element; a second magnetic sensing element, the first and second magnetic sensing elements positioned on a first substrate plane; a third magnetic sensing element positioned on a second substrate plane oriented at a non-zero angle relative to the first substrate plane; and one or more output contacts configured to provide information from the first, second, and third magnetic sensing elements indicative of a 3-dimensional (3D) position of the magnetic target.

The magnetic sensor can further comprise a processing circuit configured to receive data from the first, second, and third magnetic sensing elements and to calculate an angle of a magnetic field based on the received data. The magnetic sensor can also comprise a fourth magnetic sensing element positioned on the second substrate plane. The magnetic sensing elements can comprise at least one of an anisotropic magnetoresistive (AMR) sensing element, a giant magnetoresistive (GMR) sensing element, or tunneling magnetoresistive (TMR) sensing element. The first magnetic sensing element can comprise magnetoresistive elements arranged in a bridge configuration. In the magnetic sensor, the first substrate plane can be substantially orthogonal to the second substrate plane.

In another aspect, the present disclosure provides a system for detecting the position of a magnetic target, the system comprising: an array of magnetic sensor integrated circuits (ICs), wherein a first magnetic sensor IC of the array comprises at least three first magnetic sensing elements and one or more first output contacts configured to provide first information indicative of a 3-dimensional (3D) position of the magnetic target, and wherein a second magnetic sensor IC sensor of the array comprises at least three second magnetic sensing elements and one or more second output contacts configured to provide second information indicative of the 3D position of the magnetic target; and a computation circuit configured to output 3D position information of a magnetic target positioned in proximity to the array based on the first information and the second information.

The first magnetic sensing elements can comprise two magnetic sensing elements positioned on a first substrate plane, and another magnetic sensing element positioned on a second substrate plane, in which the second substrate plane is oriented at a non-zero angle relative to the first substrate plane. The first magnetic sensing elements can be anisotropic magnetoresistive sensing elements. The system can determine an angle of the magnetic target. The system can be configured in a non-symmetric arrangement, a rectangular arrangement, and/or a triangle arrangement. The maximum distance between two IC sensors of the IC sensors may be less than the dimensions of magnetic target in a plane that is substantially parallel to the 2-dimensional array. The computation circuit can be a microcontroller. wherein the computation circuit is configured to determine a coarse position to determine a group of magnetic sensor ICs of the array to use for a fine position measurement, wherein the group comprises the first magnetic sensor IC and the second magnetic sensor IC, and wherein the 3D position information comprises the fine position measurement. The computation circuit can determine a three-dimensional rotation of the magnetic target. The computation circuit can output three-dimensional rotation information of the magnetic target. A column of magnetic sensor ICs of the array can include magnetic sensors ICs that are unevenly spaced from adjacent magnetic sensor ICs in the column. A maximum distance between two IC adjacent magnetic sensor ICs of the array that are closest to each other can be less than a largest dimension of the magnetic target. The computation circuit can comprise a microcontroller. The computation circuit can further comprise an analog-to-digital converter coupled between the magnetic sensor ICs of the array and the microcontroller.

In another aspect, the present disclosure provides a method of determining a position of a magnetic target, the method comprising: determining a coarse position of the magnetic target to identify a group of magnetic sensors of an array of magnetic sensors that generate a signal that satisfies a threshold; measuring a rotation of the magnetic target based on measurements of at least three magnetic sensors of the group of magnetic sensors; and determining a fine position of the magnetic target based on measurements of magnetic sensors of the group of magnetic sensors.

Magnetic sensors of the array can each comprise two magnetic sensing elements in a first substrate plane and a third magnetic sensing element in a second substrate plane that is approximately orthogonal to the first substrate plane. The method can also include measuring an updated rotation of the magnetic target and determining an updated fine position of the magnetic target. The fine position can be a three-dimensional position, and measuring the rotation can comprise measuring rotation of the magnetic target in three-dimensions.

In another aspect, the present disclosure provides a method of using an integrated circuit (IC) sensor for detecting the position of a magnetic target, the method comprising: detecting a first magnetic field information at a first magnetic sensing element; detecting a second magnetic field information at a second magnetic sensing element, the first and second magnetic sensing elements positioned on a first substrate plane; detecting a third magnetic field information at a third magnetic sensing element positioned on a second substrate plane oriented at a non-zero angle relative to the first substrate plane; and providing the first, second, and third magnetic field information indicative of a 3-dimensional (3D) position of the magnetic target at one or more output contacts.

The method can further comprise processing data from the magnetic sensing elements to calculate an angle of a magnetic field associated with the magnetic target. The magnetic sensing elements can comprise of an anisotropic magnetoresistive (AMR) sensing element, a giant magnetoresistive (GMR) sensing element, or a tunneling magnetoresistive (TMR) sensing element. The magnetic sensing element may also be arranged in a bridge configuration. The method can include determining an angle of the magnetic target.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

These drawings and the associated description herein are provided to illustrate specific embodiments of the invention and are not intended to be limiting.

FIG. 9 is a schematic diagram of a sensor array and a microcontroller according to an embodiment of this disclosure.

FIG. 10 is a schematic diagram of a sensor array, an analog-to-digital converter, and a microcontroller according to an embodiment of this disclosure.

DETAILED DESCRIPTION

Figure 1:
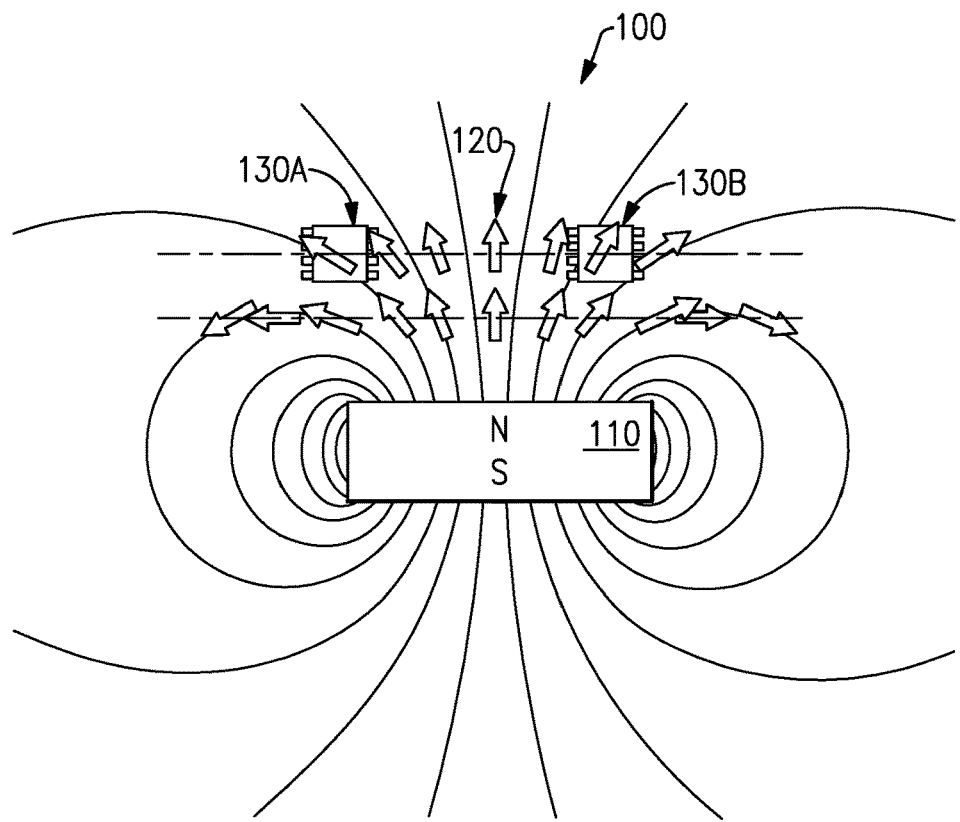
FIG. 1 is a diagram of magnetic sensors detecting magnetic fields and angles.

Various aspects of the novel systems, apparatuses, and methods are described more fully hereinafter with reference to the accompanying drawings. Aspects of this disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the novel systems, apparatuses, and methods disclosed herein, whether implemented independently of or combined with any other aspect. For example, an apparatus may be implemented or a method may be practiced using any number of the aspects set forth herein. In addition, the scope is intended to encompass such an apparatus or method which is practiced using other structure, functionality, or structure and functionality in addition to or other than the various aspects set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to a variety of systems. The detailed description and drawings are merely illustrative of the disclosure rather than limiting, the scope of the disclosure being defined by any appended claims and equivalents thereof.

In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings. The headings provided herein are for convenience only and do not necessarily affect the scope or meaning of the claims.

Aspects of this disclosure relate to detecting a 3-dimensional (3D) position and/or angle of a magnetic target. Such detecting can be implemented using magnetic field and/or angle sensors. A 3D magnetic field sensor can include at least three magnetic sensing elements. For instance, a 3D magnetic field sensor can include Hall effect sensors arranged in 3 dimensions or a monolithic integrated component that uses a soft magnetic element. With such a sensor, it is possible to calculate a field angle of a magnetic field (elevation and azimuth) using the arctangent (arctan or a tan) function. Similar calculations can be performed in connection with a 3D angle sensor that includes anisotropic magnetoresistive (AMR) sensing elements, giant magnetoresistive (GMR) sensing elements, tunneling magnetoresistive (TMR) sensing elements, the like, or any combination thereof. Magnetoresistive sensors can provide signals having amplitudes that are less affected by magnetic field strength than Hall effect sensors.

The magnetic sensing discussed herein can be implemented, for example, in industrial automation applications. For instance, the 3D position sensing discussed herein can be implemented in assembly lines with parts moving in three dimensions.

3D Magnetic Sensors

FIG. 1 is a diagram of magnetic sensors detecting magnetic fields. FIG. 1 illustrates a magnetic target 110 that is producing magnetic fields 120. In FIG. 1, magnetic sensors 130A and 130B are arranged to measure an angle of the emitted magnetic fields 120. Outputs of the magnetic sensors 130A and 130B can be used to determine a 3D position of the magnetic target 110. The position of magnetic target 110 can be detected based on the magnetic target is generating field angles that are unique around the magnetic target. FIG. 1 shows such an angle change near the magnetic target 110.

Figure 2:
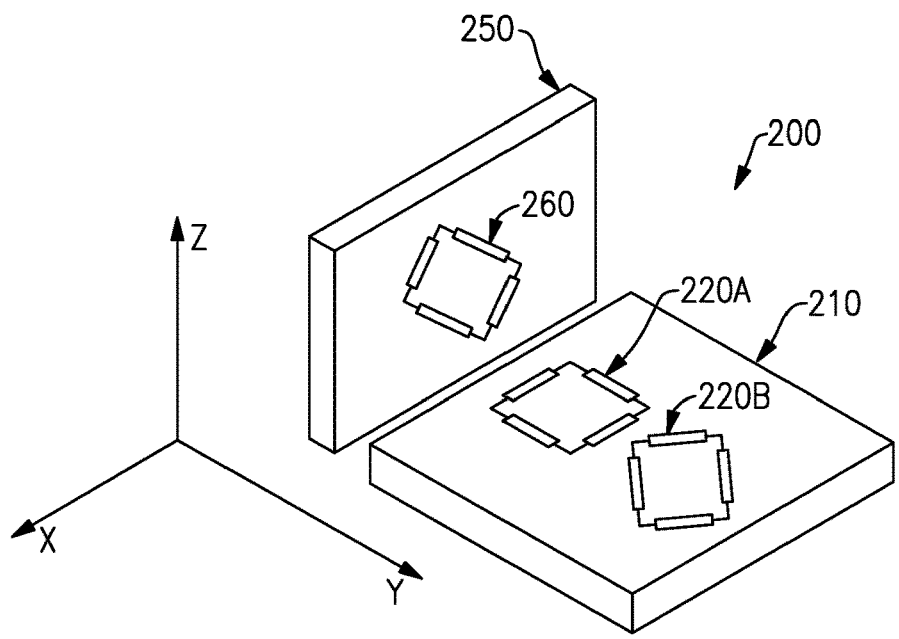
FIG. 2 is a perspective view of a 3D magnetic sensor according to an embodiment of this disclosure.

FIG. 2 is a perspective view of a 3D magnetic sensor 200 according to an embodiment of this disclosure. The 3D magnetic sensor 200 includes a first substrate 210 and a second substrate 250. Magnetic sensing elements 220A and 220B are arranged on the first substrate 210. The magnetic sensing 220A and 220B elements can measure the sine and cosine magnetic field signals, respectively. Magnetic sensing element 260 is arranged on the second substrate 250 and is configured to measure the magnetic field signals on a third axis. Each of the magnetic sensing elements 220A, 220B, and 260 can include a full bridge as illustrated. As illustrated, the magnetic sensing 220A and 220B can be oriented at an angle of about 45° relative to each other. The magnetic sensing elements 220A, 220B, and 260 can each be magnetoresistive sensing element, such as any suitable magnetoresistive (xMR) sensing element. Example xMR sensing elements include a giant magnetoresistive (GMR) sensing element, a tunneling magnetoresistive (TMR) sensing element, and an AMR sensing element. The magnetic sensing elements 220A, 220B, and 260 can be arranged to detect a magnetic field in three dimensions. The second substrate 250 is oriented at a non-zero angle relative to the first substrate 210. The first substrate 210 and the second substrate 240 can be approximately orthogonal to each other as illustrated in FIG. 2.

Figure 3:
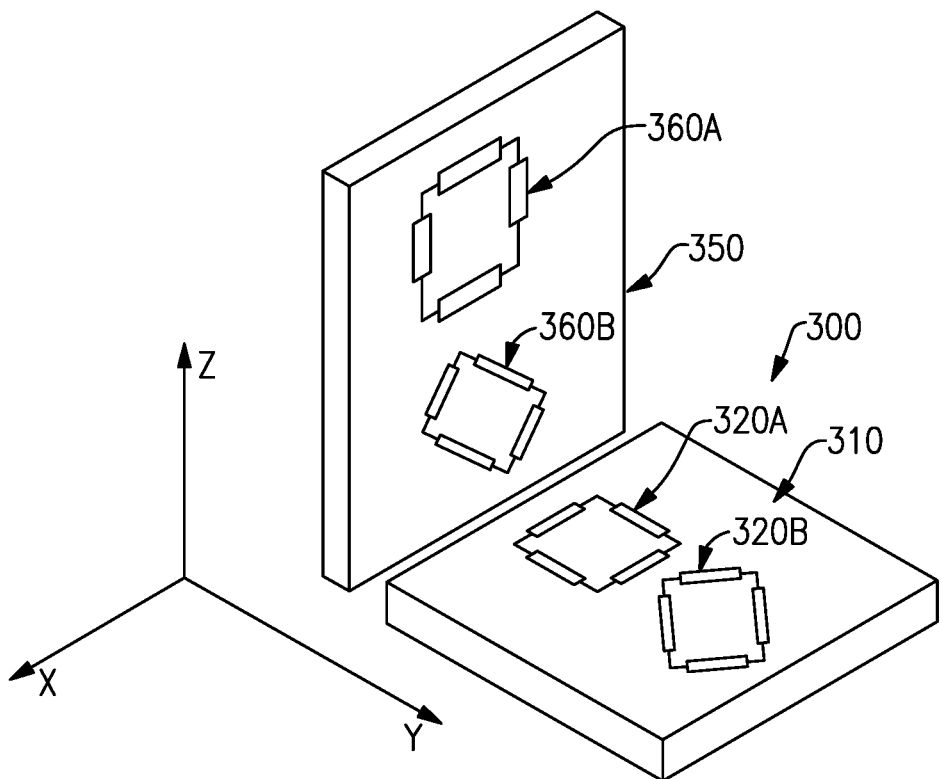
FIG. 3 is a perspective view of a 3D magnetic sensor according to an embodiment of this disclosure.

FIG. 3 is a perspective view of a 3D magnetic sensor 300 according to an embodiment of this disclosure. The 3D magnetic sensor 300 includes one more magnetic sensing element than the 3D magnetic sensor 200 of FIG. 2. The 3D magnetic sensor 300 includes a first substrate 310 and a second substrate 350. Magnetic sensing elements 320A and 320B are arranged on the first substrate 310. The magnetic sensing elements 310A and 310B can measure the sine and cosine magnetic field signals, respectively. Magnetic sensing elements 360A and 360B are arranged on second substrate 350 and can measure magnetic field signals on a third axis. The second substrate 350 is positioned at a non-zero angle compared to first substrate 310. The first substrate 310 and the second substrate 350 can be approximately orthogonal to each other as illustrated in FIG. 3. The magnetic sensing elements 320A, 320B, 360A, and 360B can be magnetic angle sensors. For instance, these sensors can be AMR sensors.

Figure 4:
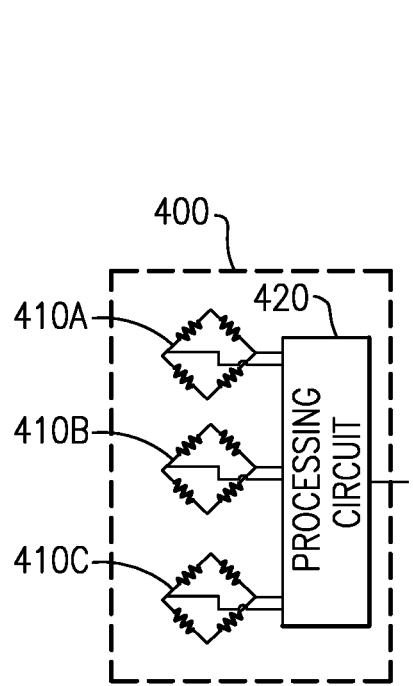
FIG. 4 is a schematic diagram of a 3D sensor according to an embodiment of this disclosure.

FIG. 4 is a schematic diagram of a 3D magnetic sensor 400 according to an embodiment of this disclosure. The 3D magnetic sensor 400 includes magnetic sensing elements 410A, 410B, and 410C. The magnetic sensing elements 410A, 410B, and 410C can correspond to the magnetic sensing elements 220A, 220B, and 260, respectively, of FIG. 2. For instance, the physical layouts of the magnetic sensing elements 410A, 410B, and 410C can be oriented relative to each other in accordance with diagram of FIG. 2. Each magnetic sensing element can include a full bridge as illustrated in FIG. 4. The magnetic sensing elements 410A, 410B, and 410C are coupled to a processing circuit 420. The processing circuit 420 is configured to receive data from the magnetic sensing elements 410A, 410B, and 410C. The processing circuit 420 can process outputs of the magnetic sensing elements 410A, 410B, and 410C. For instance, the processing circuit 420 can calculate a magnitude of a magnetic field associated with a magnetic target. The processing circuit 420 can be included in the same integrated circuit as the magnetic sensing elements 410A, 410B, and 410C. The processing circuit 420 can receive information indicating the detected magnetic field of the magnetic target and use the information to calculate a field angle of a magnetic field (elevation and azimuth) using the arctangent (arctan or a tan) function. An arctangent function with two arguments can be referred to as an a tan 2 function. In certain embodiments, an output signal of the processing circuit 420 is an analog signal (e.g., amplified signal of each magnetic sensing element 410A, 410B, and 410C). In some other embodiments, the output signal is a digital angle signal representing pairs of arctangent functions of outputs of sensing elements (e.g., a tan 2(output of magnetic sensing element 410A, output of magnetic sensing element 410B) and a tan 2(output of magnetic sensing element 410B, output of magnetic sensing element 410C)). Output(s) of the processing circuit 420 can be provided to a microcontroller to determine a 3D position of a magnetic target. In some other embodiments, outputs of one or more magnetic sensing elements can be provided to a microcontroller without further processing on the IC that includes the magnetic sensing elements. Any other suitable computation circuit can be used in place of or in combination with any of the microcontrollers discussed herein. For instance, an application specific integrated circuit (ASIC) can compute position information for a magnetic target instead of or together with a microcontroller.

Figure 5:
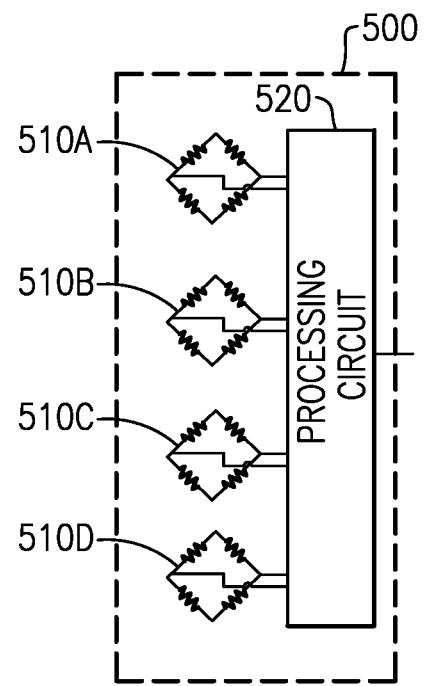
FIG. 5 is a schematic diagram of a 3D sensor according to an embodiment of this disclosure.

FIG. 5 is a schematic diagram of a 3D magnetic sensor 500 according to an embodiment of this disclosure. The 3D magnetic sensor 500 includes magnetic sensing elements 510A, 510B, 510C, and 510D. In an AMR based sensor, the magnetic sensing elements 510A, 510B, 510C, and 510D can be implemented as full bridges. Two pairs of full brides can be implemented for AMR based sensors. AMR sensors can detect an angle of a magnetic field. One bridge of each pair can be oriented at a non-zero angle (e.g., a 45 degree angle) relative to the other bridge of the pair.

The magnetic sensing elements 510A, 510B, 510C, and 510D can correspond to the magnetic sensing elements 310A, 310B, 330A, and 330B, respectively, of FIG. 3. Each magnetic sensing element can include a full bridge as illustrated in FIG. 5. The magnetic sensing elements 510A, 510B, 510C, and 510D are coupled to a processing circuit 520. The processing circuit 520 process data from the magnetic sensing elements 510A, 510B, 510C, and 510D. For instance, the processing circuit 520 can calculate an angle of a magnetic field. The processing circuit 520 can be included in the same integrated circuit as the magnetic sensing elements 510A, 510B, 510C, and 510D. Output(s) of the processing circuit 520 can be provided to a microcontroller or other computation circuit to determine a 3D position of a magnetic target. In certain embodiments, an output signal of the processing circuit 520 is an analog signal (e.g., amplified signal of each magnetic sensing element 510A, 510B, 510C, 510D). In some other embodiments, the output signal is a digital angle signal representing pairs of arctangent functions of outputs of sensing elements (e.g., a tan 2(output of magnetic sensing element 510A, output of magnetic sensing element 510B) and a tan 2(output of magnetic sensing element 510C, output of magnetic sensing element 510D)). In certain embodiments, outputs of one or more magnetic sensing elements can be provided to a microcontroller or other computation circuit without further processing on the IC that includes the magnetic sensing elements.

The magnetic field angle distribution around a bar magnet can be unique but symmetric around the bar magnet. Accordingly, a rotation of the bar magnet around the axis, pointing from the north to the south pole of the bar magnet at 180 degrees should generate the same field angle distribution. In the case of a square magnet, a rotation of 90 degrees should generate the same field angle distribution as prior to the 90 degree rotation. A non-symmetric magnetic target can generate a field distribution that is unique even after rotation in the whole angle spectrum. Accordingly, it is possible to calculate the absolute position including all angles in each physical position for a non-symmetric magnetic target. Moreover, the magnetic field angles distribution of a non-symmetrical magnetic target should be unique and predictable. Thus, it is possible to detect both the position of such a magnetic target in x-, y-, and z-axes and the rotation around all three axes based on comparing the detected field angles with the predicted field angles distribution. Accordingly, it can be advantageous to use a non-symmetric magnetic target with the magnetic sensor arrays discussed herein. An example of such a non-symmetric magnetic target will be described with reference to FIG. 6.

Figure 6:
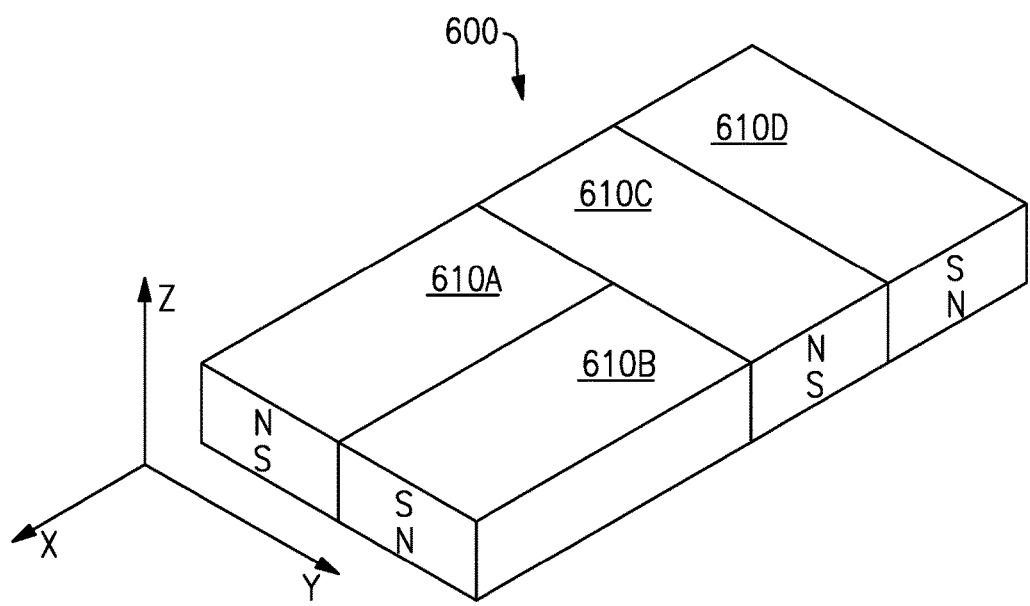
FIG. 6 is a perspective view of an example magnetic target.

FIG. 6 is a perspective view of an example magnetic target 600. The magnetic target 600 includes a plurality of magnets 610A, 610B, 610C, and 610D. The magnetic target 600 can generate magnetic field angles that are unique around the magnetic target 600. Magnetic sensors discuss herein can detect a 3D position of a magnetic target that includes two or more magnets, such as the magnetic target 600. Magnetic sensors discussed herein can also detect a 3D position of a magnetic target that includes a single magnet.

Magnetic sensor integrated circuits (ICs) discussed herein can be arranged in 2D arrays. Such arrays can be used to determine a 3D position of a magnetic target. Any of the magnetic sensor IC arrays discussed herein can include any suitable number of magnetic sensor ICs. As an example, hundreds or thousands of such magnetic sensor ICs can be included in a 2D array. Example magnetic sensor IC arrays will be discussed. However, any suitable arrangement of magnetic sensor ICs can be implemented to determine 3D position of a magnetic target.

Figure 7:
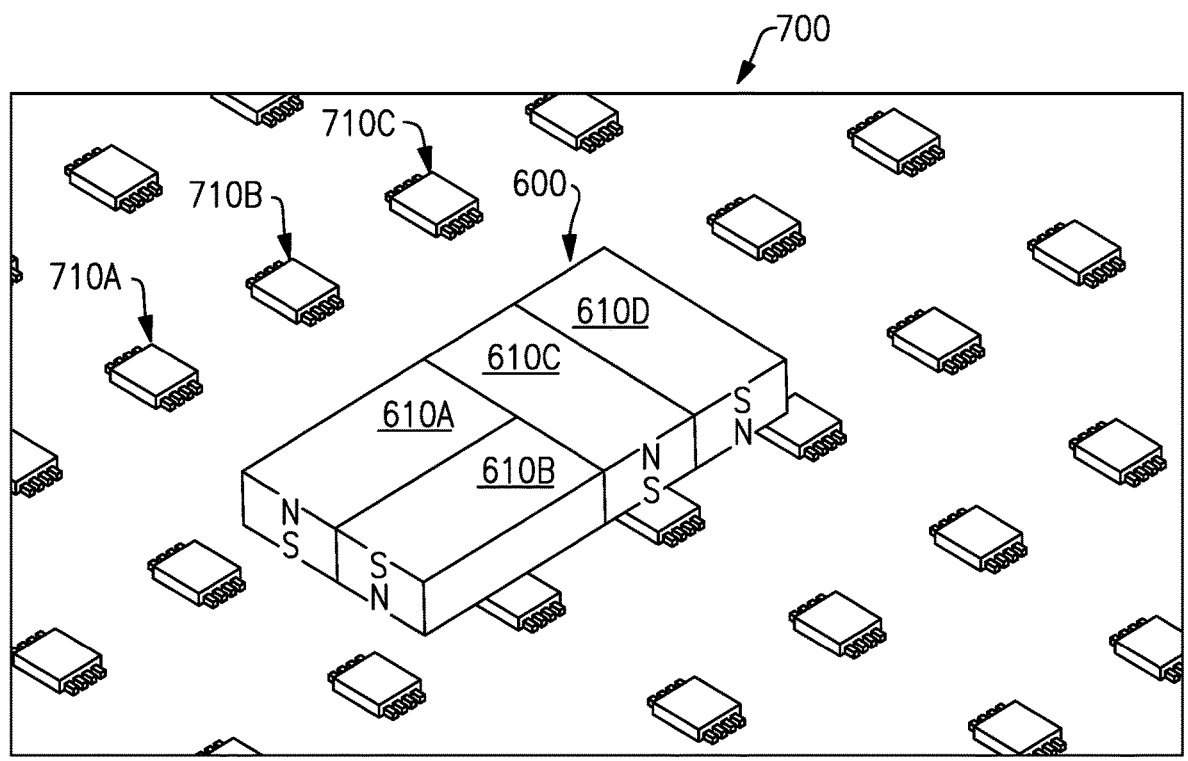
FIG. 7 is a perspective view of a magnetic target and a sensor array according to an embodiment of this disclosure.

FIG. 7 is a perspective view of a magnetic target 600 as described in FIG. 6 and a 2D sensor array 700 according to one embodiment of the disclosure. The 2D sensor array 200 can be used to detect the field angle at several different positions. The magnetic target 600 may include a plurality of magnets 610A, 610B, 610C, and 610D. The sensor array 700 includes 3D magnetic sensor ICs including magnetic sensor ICs 710A, 710B, and 710C. As illustrated, the sensor array 700 includes a number of additional sensor ICs than the magnetic sensor ICs 710A, 710B, and 710C. Each of the 3D magnetic sensor ICs can be implemented in accordance with any suitable principles and advantages discussed with reference to FIGS. 2 to 5. For instance, each of the 3D magnetic sensor ICs 710A, 710B, and 710C can include the 3D magnetic sensor of FIG. 2, the 3D magnetic sensor of FIG. 3, the 3D magnetic sensor of FIG. 4, or the 3D magnetic sensor of FIG. 5, or any suitable combination of features of these 3D magnetic sensors. The field angle distribution should be unique for magnetic target 600. Detection of the field angles can provide information about the field angles at different positions and the position of the magnetic target 600 can be determined from such information.

Measuring an angle of a magnetic field angle instead of a magnitude of the magnetic field associated with a magnetic target can be desirable in some instances. The magnetic field strength (i.e., magnitude) around a magnetic target can change significantly with variations in the temperature of the magnetic target. This can be due to the temperature coefficient of the magnetic remanence and coercivity. In comparison, the magnetic field angle can remain substantially constant in a given temperature range. Thus, by measuring magnetic field angle rather than magnetic field magnitude, an impact of temperature on a measurement of a position of a magnetic target can be reduced. Moreover, the magnetic field angle distribution of certain magnetic targets should be unique and predictable. Thus, it is possible to detect both the position of such a magnetic target in x-, y-, and z-axes and the rotation around all three axes using an array of 3D magnetic position sensor ICs based on comparing the detected field angles with the predicted field angles distribution.

Magnetic Sensor IC Arrays

Magnetic sensor ICs can be arranged in an array in a variety of different ways. Some example magnetic IC sensor arrays will be described. Any suitable principles and advantages of these sensor arrays can be implemented in combination with each other.

Figure 8A:
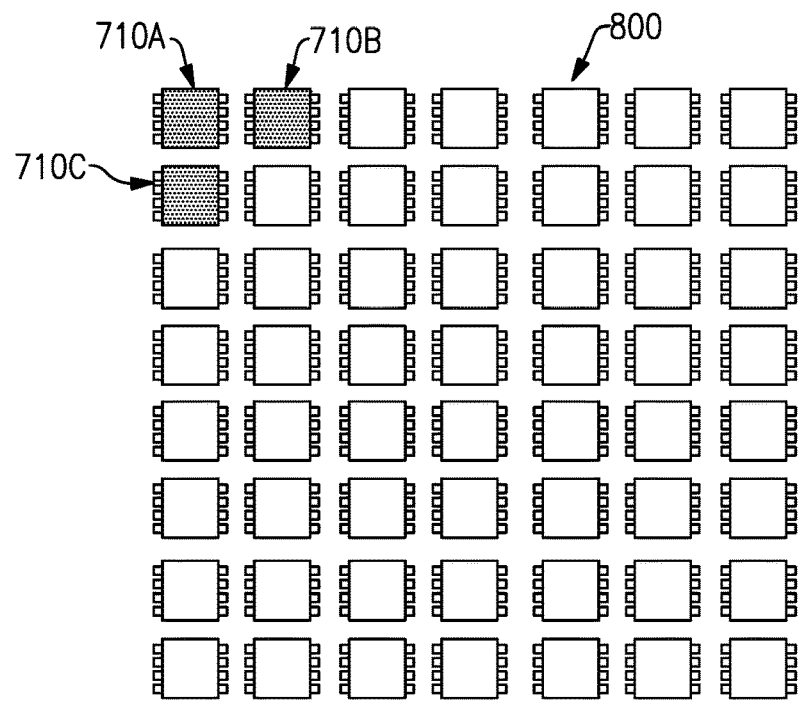
FIG. 8A is a plan view of a sensor array according to an embodiment of this disclosure.

FIG. 8A is a plan view of a sensor array 800 according to an embodiment of this disclosure. The sensor array 800 includes magnetic sensor integrated circuits 710A, 710B, and 710C and a number of additional sensors as illustrated in FIG. 8A. Each of the magnetic sensors of the sensor array 800 can be implemented by a separate IC in accordance with any suitable principles and advantages of FIGS. 2 to 5. As illustrated in FIG. 8A, the magnetic sensors are configured in a rectangular (e.g., a square) shaped arrangement. The sensor array 800 includes magnetic sensors arranged in rows and columns. The illustrated magnetic sensors are regularly spaced apart from each other in rows and in columns. The maximum distance between two magnetic sensors that are closest to each other in the same column or the same row may be shorter than dimensions of a magnetic target being sensed by the sensor array 800. More specifically, for the magnetic target 600 of FIG. 6, the maximum distance between two magnetic sensors that are closest to each other in the same column or the same row can be less that the a larger of the x or y dimension of the magnetic target 600. In some embodiments, three neighboring sensors in the sensor array 800 are configured in a triangle shaped arrangement (e.g. magnetic sensors 710A, 710B, and 710C). The three sensor arrangement provides magnetic field and rotation measurements for calculating the position of a magnetic target as described below. The distance between each group of two sensors in the sensor array 900 can be less than the dimensions of a magnetic target being sensed by the sensor array 800.

Figure 8B:
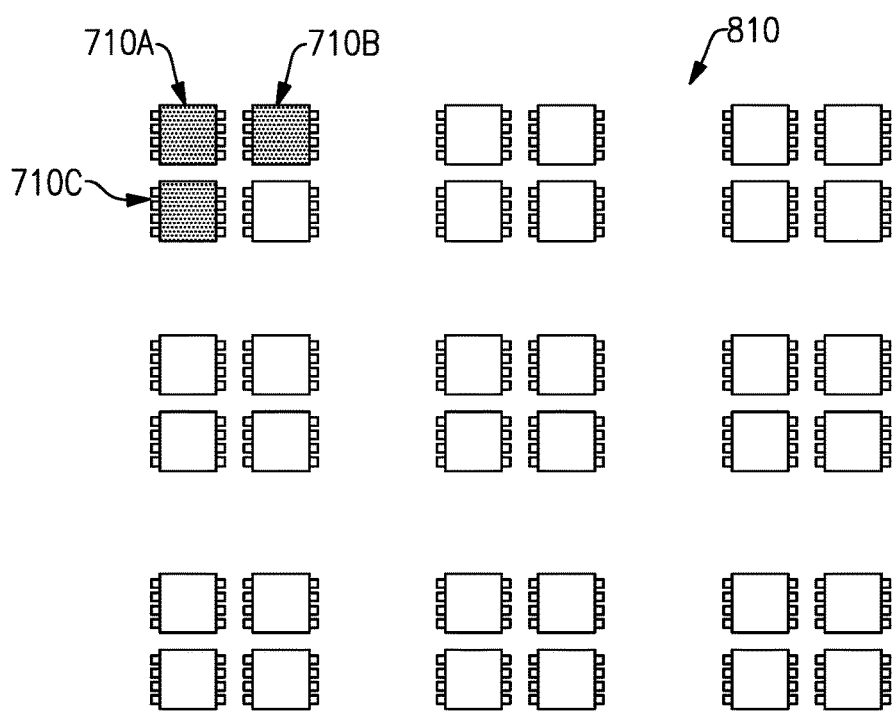
FIG. 8B is a plan view of a sensor array according to an embodiment of this disclosure.

FIG. 8B is a plan view of a reduced sensor array 810 according to an embodiment of this disclosure. The reduced sensor array 810 includes fewer magnetic sensors compared to the rectangular sensor array 800 of FIG. 8A. With a reduced sensor array, accurate position and/or field angle measurements can be obtained with fewer magnetic sensors than in the magnetic sensor array 800 of FIG. 8A. The sensor array 810 includes magnetic sensors 710A, 710B, and 710C and a number of additional sensors as illustrated in FIG. 8B. Each of the magnetic sensors of the sensor array 810 can be implemented by a separate IC in accordance with any suitable principles and advantages of FIGS. 2 to 5. In this embodiment, the magnetic sensors are configured in a reduced rectangular (e.g., a square) shaped arrangement. The illustrated sensor array 810 includes clusters of 4 magnetic sensor ICs. The maximum distance between two magnetic sensors that are closest to each other in the same column or the same row may be shorter than dimensions of a magnetic target being sensed by the sensor array 810. In some embodiments, three neighboring sensors in the sensor array 800 are configured in a triangle shaped arrangement (e.g., magnetic sensors 710A, 710B, and 710C in FIG. 8B). The three sensor arrangement provides magnetic field and rotation measurements for calculating the position of a magnetic target, for example, as described below. The distance between each group of two sensors in a reduced rectangle of the sensor array 810 can be less than the dimensions of a magnetic target being sensed by the sensor array 810.

Figure 8C:
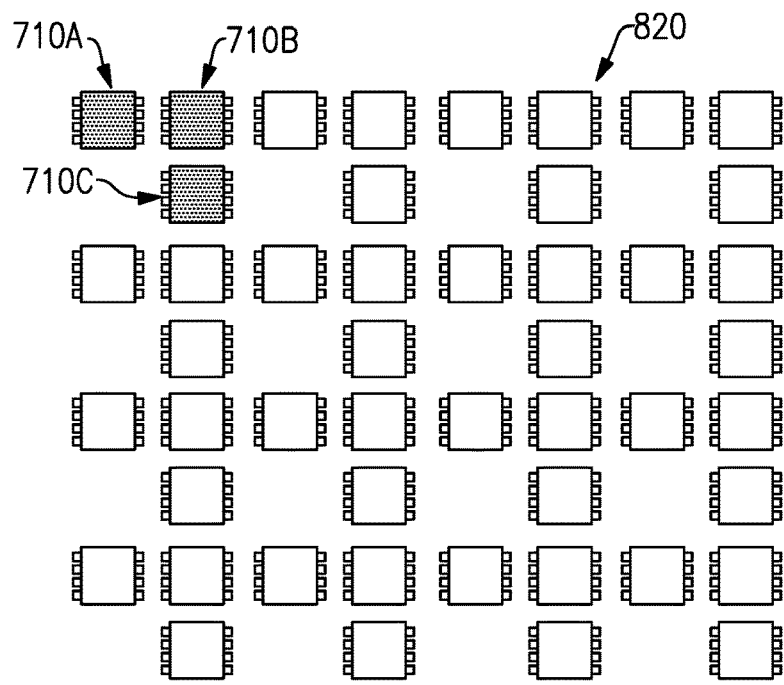
FIG. 8C is a plan view of a sensor array according to an embodiment of this disclosure.
Figure 8D:
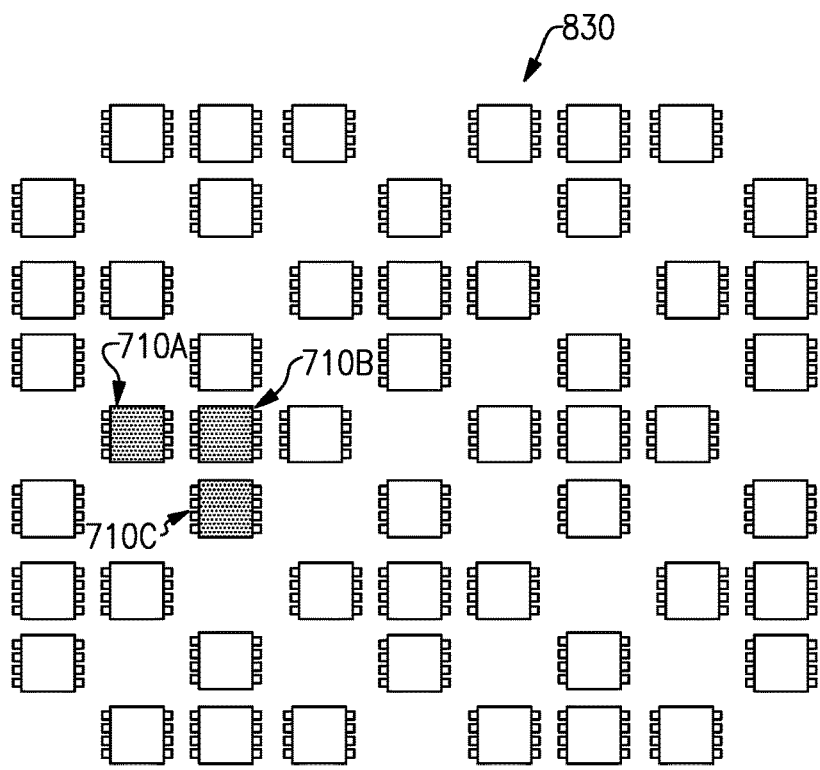
FIG. 8D is a plan view of a sensor array according to an embodiment of this disclosure.

FIGS. 8C and 8D are plan views of other embodiments of reduced sensor arrays 820 and 830, respectively. These reduced sensor arrays include fewer magnetic sensors compared to the regular rectangular sensor array of FIG. 8A. The illustrated sensor arrays 820 and 830 each include magnetic sensors 710A, 710B, and 710C and a number of additional sensors. Each of the magnetic sensors of the sensor array 820 or 830 can be implemented by a separate IC accordance with any suitable principles and advantages of FIGS. 2 to 5. The maximum distance between two magnetic sensors that are closest to each other in the same column or the same row may be shorter than dimensions of a magnetic target being sensed by the sensor array 820 or 830. In some embodi-ments, three neighboring sensors in the sensor array 820 or 830 are configured in a triangle shaped arrangement (e.g. magnetic sensors 710A, 710B, and 710C). The three sensor arrangement provides magnetic field and rotation measurements for calculating the position of a magnetic target as described below. The distance between each group of two sensors in the sensor array 820 or 830 can be less than the dimensions of a magnetic target being sensed by the sensor array 820 or 830.

Figure 8E:
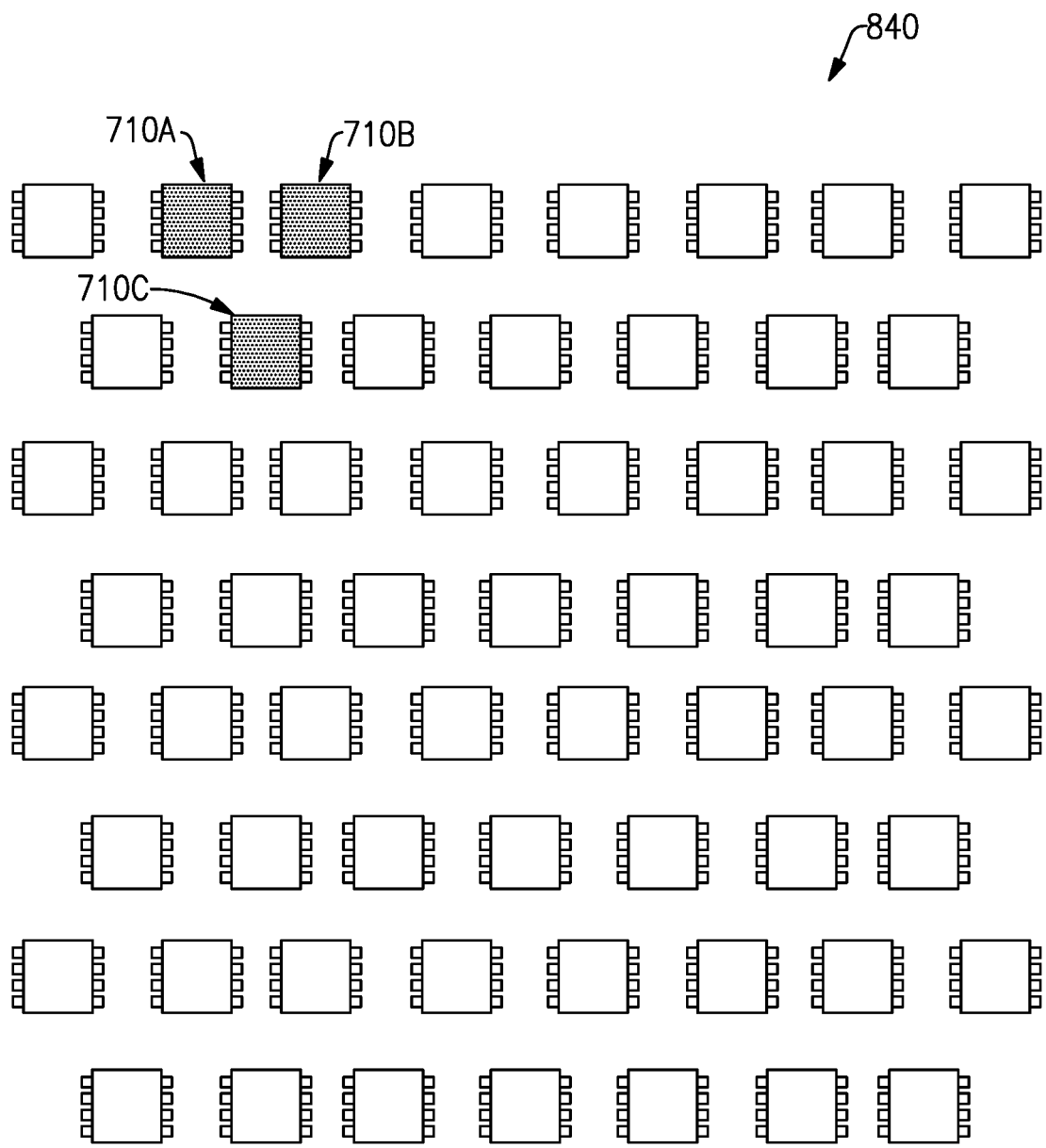
FIG. 8E is a plan view of a sensor array according to an embodiment of this disclosure.
Figure 8F:
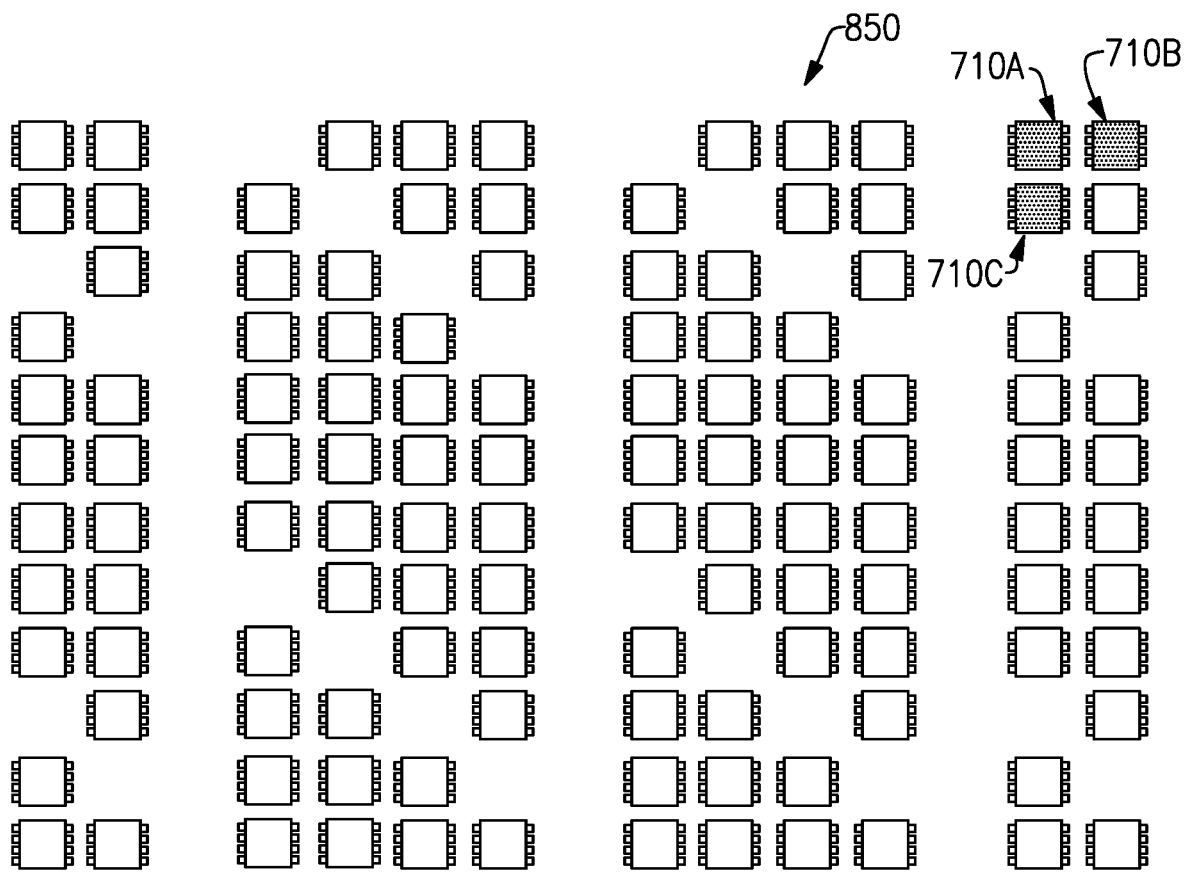
FIG. 8F is a plan view of a sensor array according to an embodiment of this disclosure.

Additional magnetic sensor arrays 840 and 850 are shown in FIGS. 8E and 8F, respectively. These magnetic sensor arrays are alternative ways of implementing an array of magnetic sensor ICs in accordance with the principles and advantages discussed herein. The magnetic sensor array 840 of FIG. 8E includes groups of three magnetic sensor ICs configured in a triangle shaped arrangement. The distance between each group of two sensors in the sensor array 840 can be less than dimensions of a magnetic target being sensed by the sensor array 840. The sensor array 850 shows an alternative arrangement of magnetic sensor ICs.

A computation circuit can be implemented with a magnetic sensor array to process outputs of the magnetic sensor ICs. Such a computation circuit can compute position and/or field angles. A computation circuit can include a microcontroller. In some instances, a computation circuit can include an analog-to-digital converter and a microcontroller. Any other suitable computation circuits can be implemented in accordance with the principles and advantages discussed herein. For instance, a computation circuit can include an ASIC. As another example, a computation circuit can include a processor combined with memory.

FIG. 9 is a schematic diagram view of a sensor array 900 and a microcontroller 920 according to an embodiment of this disclosure. The sensor array 900 includes magnetic sensor ICs including magnetic sensor ICs 710A, 710B, and 710C and additional magnetic sensor ICs as illustrated. The microcontroller 920 is a computation circuit that can compute position and rotation information for a magnetic target. The microcontroller 920 is in communication with the magnetic sensor ICs of the sensor array 900. In one embodiment, the microcontroller 920 receives all angle information from all sensors. Then the microcontroller 920 can compare the detected field angles distribution with the known field angles distribution of the magnetic target to determine a first position. In a subsequent operation, the microcontroller 920 can receive signals from a subset of sensors of the sensor array 900 that are close to the magnetic target (e.g., at least three magnetic sensing elements). Using this information, the microcontroller 920 can perform the same operation (e.g., comparison with known field distribution). Depending on the position result, microcontroller 920 can receive different sensor signals from different sensors in another subsequent operation. By performing these operations, microcontroller 920 can output 3D position information of a magnetic target positioned in proximity to the sensor array 900 based on the outputs of the 3D sensors.

FIG. 10 is a diagram view of a sensor array 1000 with a computation circuit according to an embodiment of this disclosure. The sensor array 1000 includes magnetic sensor ICs including magnetic sensor ICs 710A, 710B, and 710C and additional magnetic sensor ICs as illustrated. In FIG. 10, the computation circuit includes an analog-to-digital converter 1030 and a microcontroller 1020. The analog-to-digital converter 1030 is in communication with the magnetic sensor ICs of the sensor array 1000. The embodiment shown in FIG. 10 is like the embodiment shown in FIG. 9 except that the ADC 1030 converts analog outputs the magnetic sensor ICs to digital signals for the microcontroller 1020. In FIG. 10, the analog-to-digital converter 1030 is configured to output digital signals representative of 3D position information of a magnetic target positioned in proximity to the sensor array 1000 based on the outputs of the magnetic sensor ICs.

Other Magnetic Sensors

Embodiments discussed above include magnetoresistive sensing elements. Other types of magnetic sensors can alternatively or additionally be implemented. Such sensors can be implemented in arrays in accordance with any suitable principles and advantages discussed herein. An example 3D magnetic sensor that includes Hall effect sensors will be now described.

Figure 11A:
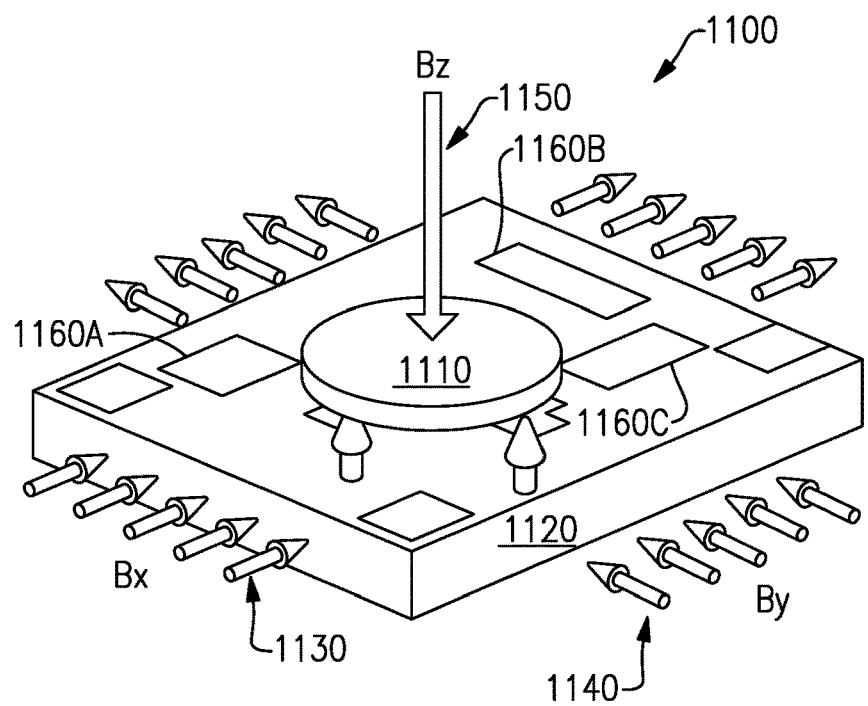
FIG. 11A is a perspective view of a 3D sensor including Hall effect sensors with a soft magnetic part according to an embodiment of this disclosure.

FIG. 11A is a perspective view of a 3D magnetic sensor including Hall effect sensors and a soft magnetic component arranged according to an embodiment of this disclosure. The illustrated 3D sensor 1100 includes a soft magnetic component 1110 positioned on substrate 1120. The 3D sensor 1100 also includes Hall effect sensors 1160A, 1160B, and 1160C. The 3D sensor 1100 can detect magnetic fields along the x-axis 1130, magnetic fields along the y-axis 1140, and magnetic fields along the z-axis 1150. Using the illustrated 3D sensor 1100, the field angle of a magnetic field (elevation and azimuth) can be calculated using the arctangent (arctan or a tan) function.

Figure 11B:
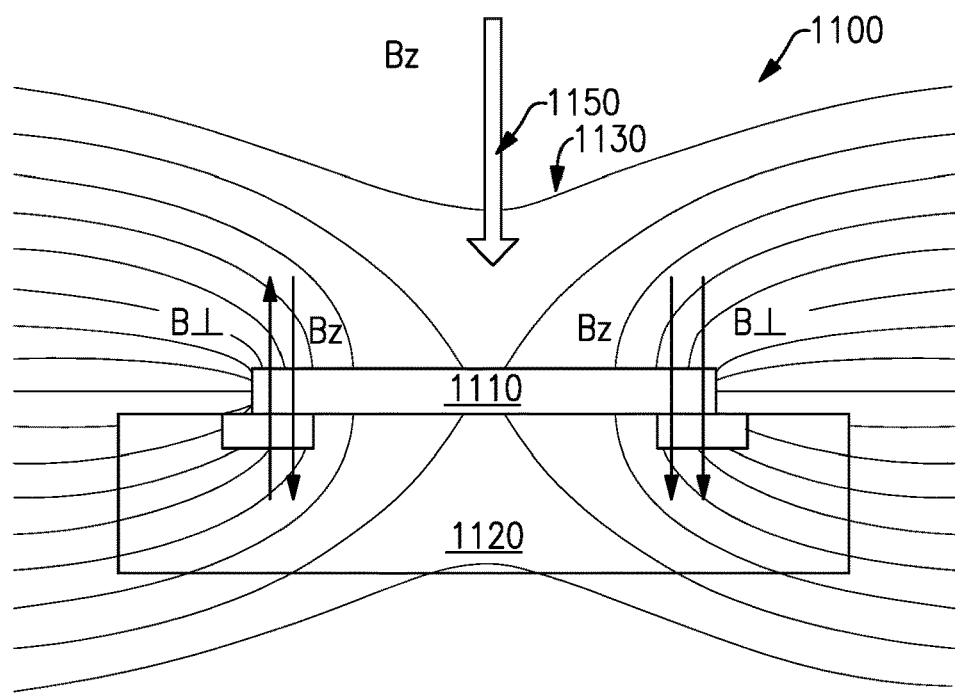
FIG. 11B is a side view of the 3D sensor of FIG. 12 with a homogenous magnetic field affected by the soft magnetic part.

FIG. 11B is a side view of the 3D sensor 1100 of FIG. 11A and a homogenous magnetic field affected by the soft magnetic component 1110. As illustrated, the soft magnetic component 1110 bends the magnetic flux 1130.

Methods of Determining Magnetic Target Position and Rotation

With an array of magnetic sensor ICs in accordance with the principles and advantages discussed herein, a 3-dimensional position and 3-dimensional rotation of a magnetic target can be determined. Example methods of determining magnetic target position and rotation will be discussed. These methods can be performed with magnetic sensors and/or an array of magnetic sensor ICs having one or more features discussed herein. Operations of any the methods discussed herein can be performed in any suitable order. Certain operations or any of the methods discussed herein can be performed serially or in parallel as suitable.

Figure 12:
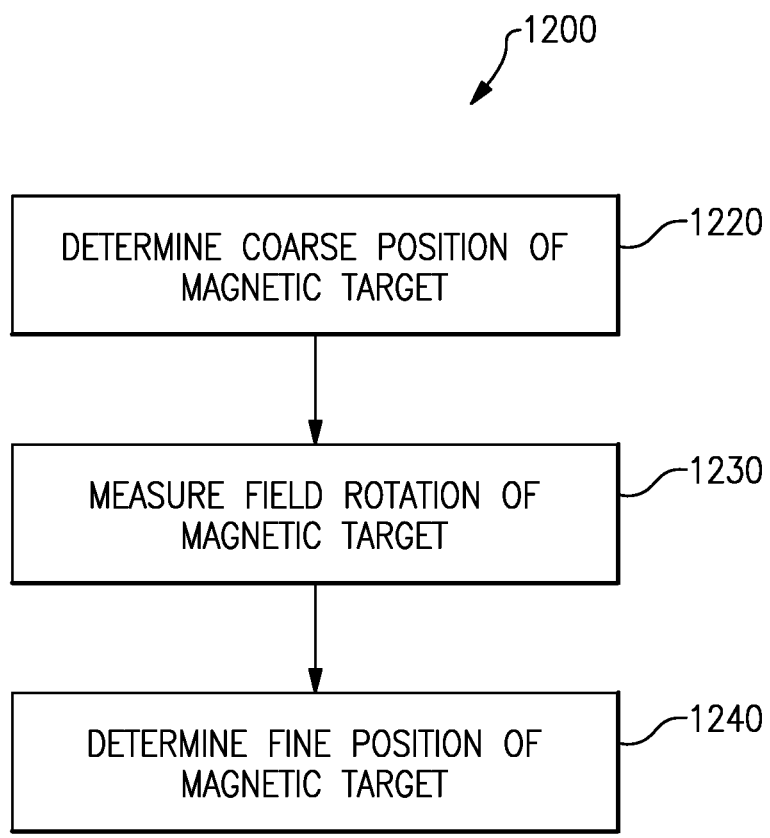
FIG. 12 is a flowchart of a 3D position determining process according to an embodiment of this disclosure.

FIG. 12 is a flowchart of a process 1200 of determining a position and rotation of a magnetic target according to an embodiment of this disclosure. The process 1200 includes determining a coarse position at block 1220, measuring a field rotation of a magnetic target at block 1230, and determining a fine position of the magnetic target at block 1240.

At block 1220, a coarse position of a magnetic target is determined. A magnetic sensor, such as a magnetic sensor of any one of FIGS. 2 to 5, can generate an output indicative of the magnetic fields or angles associated with the magnetic target. A computation circuit can determine whether a detected magnetic field exceeds a threshold value. The computation circuit can be implemented on a magnetic sensor IC, external to magnetic sensor ICs, or partially on a magnetic sensor IC and partially external to the magnetic sensor IC. The computation circuit can determine whether the inequality of Equation 1 is valid.

$$\sin(x)^2 + \cos(x)^2 \geq \text{threshold} \qquad (1)$$

In an example, the threshold value can be about 8 KA/m. When the magnitude of the detected magnetic field is greater than 8 KA/m, then the detection is valid. However, if the magnitude of the detected magnetic field is less than 8 KA/m, then the detection is invalid. Other values may be used as the threshold value.

Figure 13A:
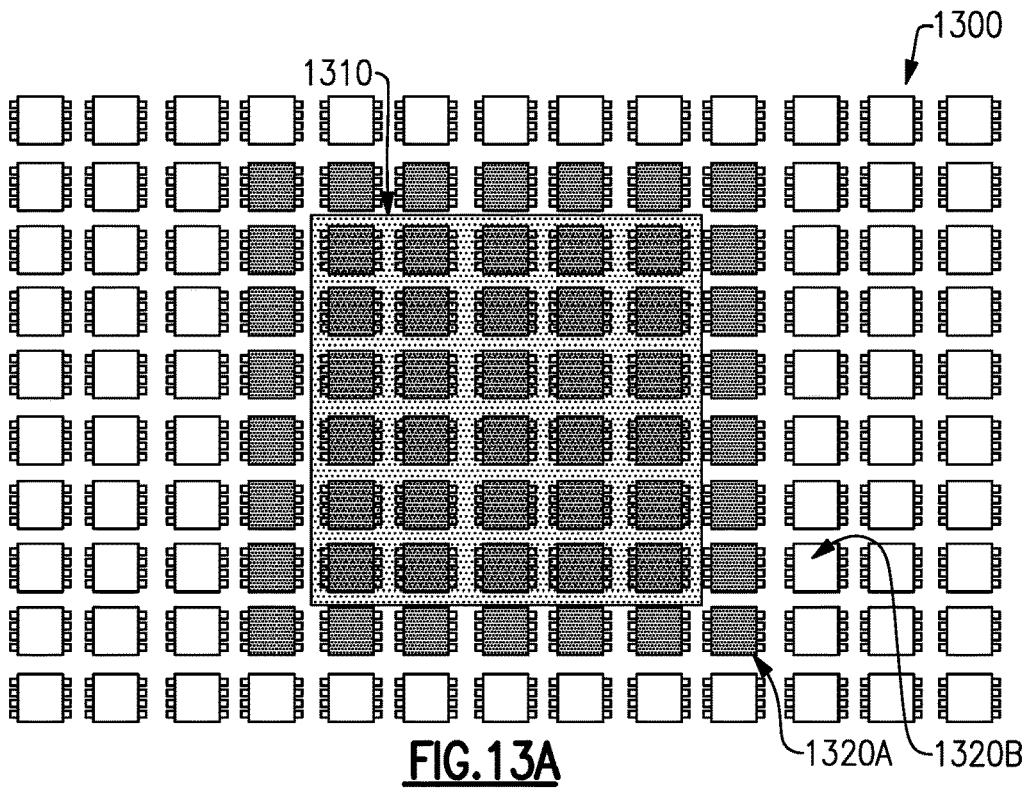
FIG. 13A is a plan view of a sensor array and a magnetic target illustrating a coarse position determination corresponding to the method of FIG. 12.
Figure 13B:
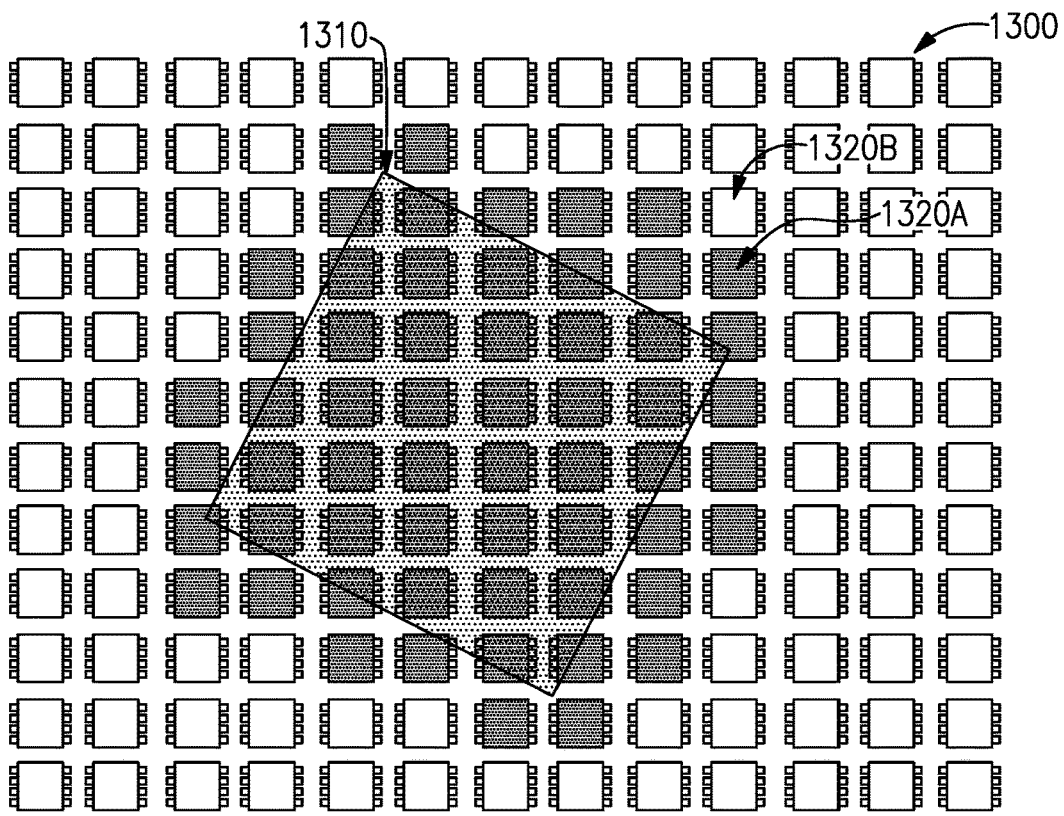
FIG. 13B is a plan view of a sensor array and a magnetic target illustrating a coarse position determination corresponding to the method of FIG. 12 when the magnetic target is in a different position than in FIG. 13A.

FIGS. 13A and 13B are plan views of a sensor array 1300 illustrating the coarse position determination process of block 1220. FIGS. 13A and 13B illustrate different positions of a magnetic target 1310 and different coarse positions of the magnetic target 1310. For example, the magnetic target 1310 can initially be in the position of FIG. 13A and then move to the position of FIG. 13B. A plurality of magnetic sensor ICs may be arranged in an array. The validity determination described above using Equation 1 can be performed for each magnetic sensor IC. The validity determination can be performed by a computation circuit on each magnetic sensor or by a computation circuit in communication with the magnetic sensor ICs of the array. Each magnetic sensor IC may be designated as valid (e.g., the shaded magnetic sensor ICs such as magnetic sensor 1320A) or as invalid (e.g., the magnetic sensor ICs that are not shaded such as magnetic sensor 1320B). In some embodiments, a microcontroller 920 or 1020 (not shown) may be configured to store information indication of whether each magnetic sensor IC is valid. A magnetic image can be output from such a microcontroller that includes a map of every valid sensor reflecting a coarse position of magnetic target 1310.

Returning to FIG. 12, at block 1230, the magnetic field rotation associated with a magnetic target is detected. The magnetic field rotation can be determined in 3-dimensions. The field rotation information from valid sensors as determined at block 1220 can be used at block 1230. Information from the invalid sensors as determined at block 1220 can be ignored for purposes of determining field rotation. The orientation of the magnetic target can be known before measurements are taken. The magnetic target can be asymmetric. Each magnetic sensor IC of the array is an independent sensor that can provide information indicative of the field rotation oriented around an axis, such as the x-axis or the y-axis shown in FIG. 14A. When the magnetic target is rotated, then the magnetic sensor ICs can provide information indicative of the field rotation oriented around a rotated axis, such as the x'-axis or y'-axis shown in FIG. 14B. The distance that the magnetic target moves in the x-axis and the y-axis due to the rotation of the magnetic target can be calculated using the Equation 2:

$$\text{dist} = \arctan 2(\text{1st sensor}) - \arctan 2(\text{2nd sensor}) \qquad (2)$$

Figure 14A:
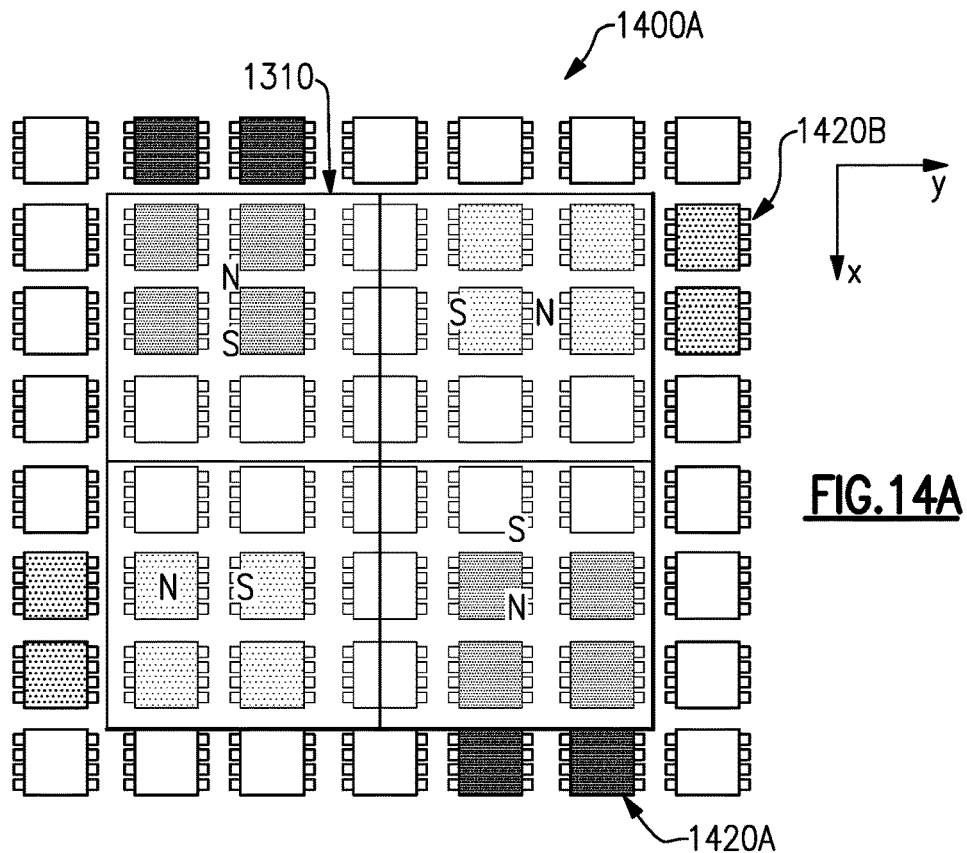
FIG. 14A is a plan view of a sub-array of sensors and the magnetic target corresponding to determining field rotation measuring in the process of FIG. 12.
Figure 14B:
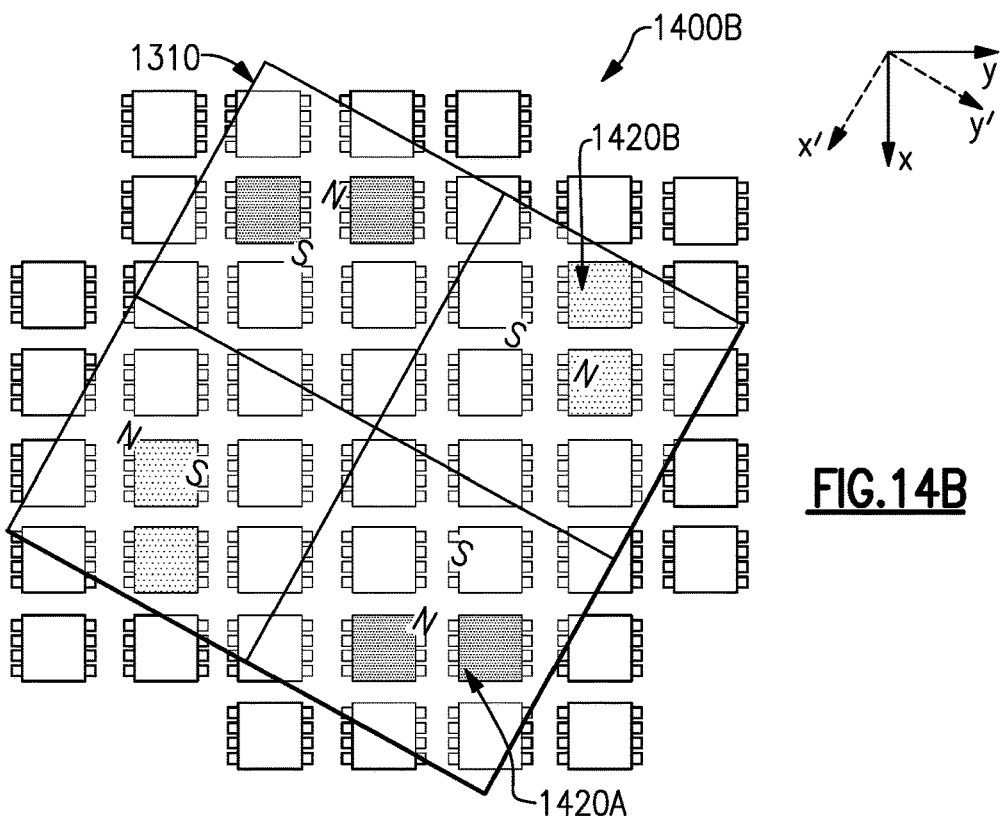
FIG. 14B a plan view of different sub-arrays of sensors and the magnetic target corresponding to determining field rotation measuring in the process of FIG. 12 when the magnetic target is in a different position than in FIG. 14A.

FIGS. 14A and 14B are plan views of sub-arrays of magnetic ICs sensors of the array of FIGS. 13A and 13B illustrating the field rotation measurement process of block 1230. FIG. 14A illustrates sub-array 1400A of the sensor array 1300 corresponding to the position of the magnetic target 1310 in FIG. 13A. FIG. 14B illustrates sub-array 1400B of the sensor array 1300 corresponding to the position of the magnetic target 1310 in FIG. 13B. A subset of magnetic sensor ICs the array 1300 identified as valid at block 1220 can perform the field rotation measurement, for example, in accordance with Equation 2. FIGS. 14A and 14B include magnetic sensor IC 1420A and other similarly shaded magnetic sensor ICs that provide information indicative of the field rotation around the x-axis. FIGS. 14A and 14B also include magnetic sensor IC 1420B and other similarly shaded magnetic sensor ICs that provide information indicative of the field rotation around the y-axis. FIG. 14B shows magnetic sensor sub-array 1400B after the magnetic target has been rotated. In FIG. 14B, magnetic sensor IC 1420A and similarly shaded magnetic sensor ICs provide information indicative of the field rotation on the x'-axis, and magnetic sensor IC 1420B and similarly shaded magnetic sensor ICs provide information indicative of the field rotation on the y'-axis.

Returning to FIG. 12, at block 1240, the fine position associated with the magnetic target can be determined. The fine position is determined using Equation 3:

$$\text{position} = \frac{\text{real\_dist}}{\text{arctan2}(2nd\ \text{sensor}) - \text{arctan2}(1st\ \text{sensor})} * \text{arctan2}(1st\ \text{sensor}) \quad (3)$$

In Equation 3, the real_dist value represents a known physical distance between magnetic sensor ICs and position can be a fine position measurement in a particular dimension, such as the x-dimension. With Equation 3, the position of the magnetic target can be determined relative to magnetic sensor IC position.

The order that the operations of process 1200 are performed may vary according to certain embodiments. For example, the coarse position determination at block 1220 may be performed for the magnetic target for the x-axis, y-axis, and then z-axis. Then the magnetic field rotation determination at block 1230 can be performed for the x-axis, y-axis, and then z-axis. Finally, the fine position determination at block 1240 can be performed for the x-axis, y-axis, and then z-axis. Alternatively, the operations at blocks 1220, 1230, and 1240 may be performed to determine the position of the magnetic target in the x-axis, then to determine the position of the magnetic target in the y-axis, and then to determine the position of the magnetic target in the z-axis. In another example, the various operations of the process 1200 may be performed in parallel for position in different dimensions.

Figure 15:
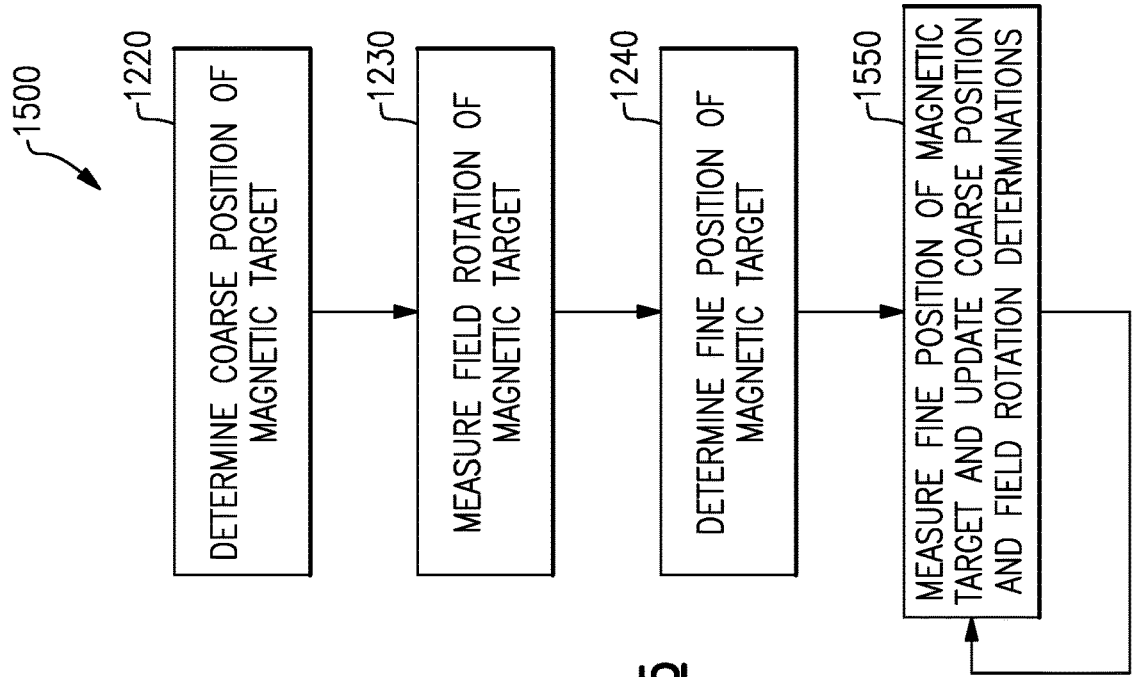
FIG. 15 is a flowchart of a 3D position determining process according to an embodiment of this disclosure.

FIG. 15 is a flowchart of a process 1500 for determining a position and rotation of a magnetic target according to an embodiment. The process 1500 is like the process 1200 of FIG. 12 except that the process 1500 can update measurements differently than the process 1200. The processes 1200 and 1500 can each include determining a coarse position of a magnetic target at block 1220, measuring a field rotation of the magnetic target at block 1230, and determining a fine position of the magnetic target at block 1240. Once these operations have been performed, the process 1500 can measure an updated fine position of the magnetic target at block 1550. The coarse position and/or field rotation determinations can be updated at block 1550 based on the updated fine position determination.

Figure 16:
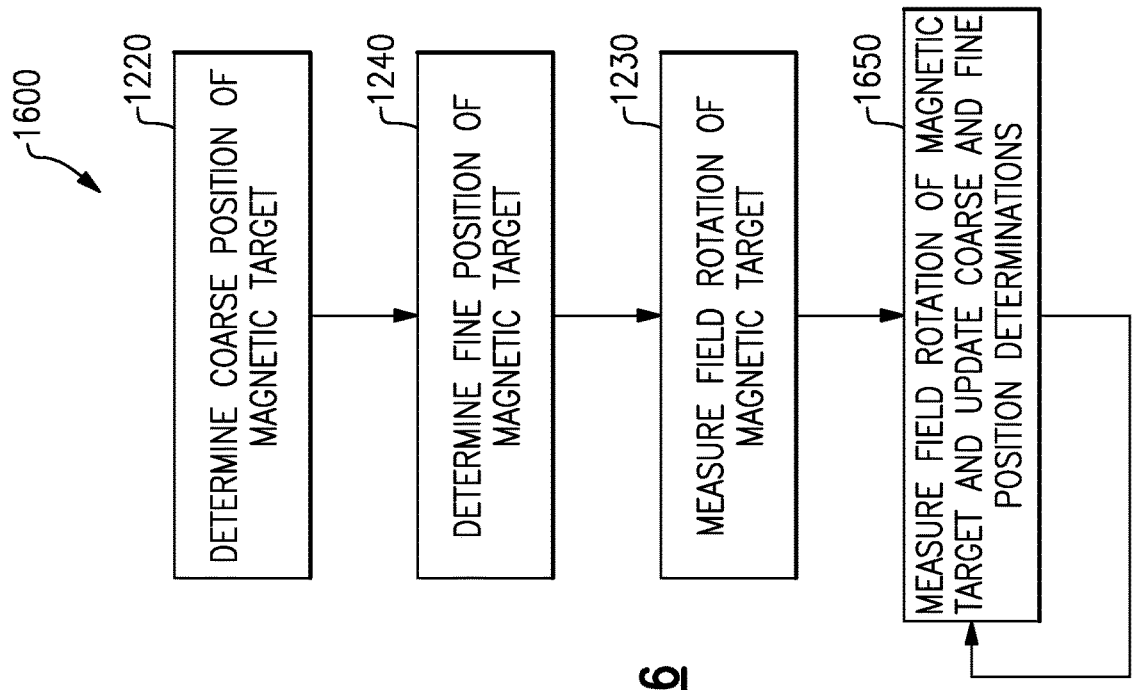
FIG. 16 is a flowchart of a 3D position determining process according to an embodiment of this disclosure.

FIG. 16 is a flowchart of a process 1600 for determining position and rotation of a magnetic target according to an embodiment. The process 1600 is like the process 1500 of FIG. 15 except that operations can be performed in a different order and measurements can be updated differently. In the process 1600, the fine position determination at block 1240 can be performed before measuring the field rotation at block 1230. The process 1600 can measure an updated field rotation at block 1650. The coarse position and/or fine position determinations can be updated at block 1650 based on the updated fine field rotation.

Applications and Terminology

Aspects of this disclosure can be implemented in various electronic devices. Examples of the electronic devices can include, but are not limited to, consumer electronic products, parts of the consumer electronic products, electronic test equipment, industrial electronic equipment, vehicular electronics systems, etc. Examples of the electronic devices can include, but are not limited to, computing devices, assembly line electronics, communications devices, electronic household appliances, automotive electronics systems, etc. Further, the electronic devices can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. Where the context permits, the word "or" in reference to a list of two or more items is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like. Further, a "channel width" as used herein may encompass or may also be referred to as a bandwidth in certain aspects.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

The various illustrative logical blocks, modules, and circuits described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more operations or actions for achieving the described method. The method operations and/or actions may be interchanged with one another without departing from the scope of the disclosure as suitable. In other words, unless a specific order of steps or actions is specified, the order and/or use of specific operations and/or actions may be modified without departing from the scope of the disclosure.

It is to be understood that the implementations are not limited to the precise configuration and components illustrated above. Various modifications, changes and variations may be made in the arrangement, operation and details of the methods and apparatus described above without departing from the scope of the implementations.

Although this disclosure has been described with reference to certain embodiments, other embodiments that are apparent to those of ordinary skill in the art, including embodiments that do not provide all of the features and advantages set forth herein, are also within the scope of this disclosure. Moreover, the various embodiments described above can be combined to provide further embodiments. In addition, certain features shown in the context of one embodiment can be incorporated into other embodiments as well.

What is claimed is:

1. A system for detecting a position of a magnetic target, the system comprising:
    an array of magnetic sensor integrated circuits (ICs), wherein a first magnetic sensor IC of the array comprises at least three first magnetic sensing elements and one or more first output contacts configured to provide first information indicative of a 3-dimensional (3D) position of the magnetic target, wherein the at least three first magnetic sensing elements comprise two magnetic sensing elements positioned on a first substrate plane and another magnetic sensing element positioned on a second substrate plane, the second substrate plane oriented at a non-zero angle relative to the first substrate plane, and wherein a second magnetic sensor IC of the array comprises at least three second magnetic sensing elements and one or more second output contacts configured to provide second information indicative of the 3D position of the magnetic target; and
    a computation circuit configured to output 3D position information of the magnetic target positioned in proximity to the array based on the first information and the second information.

2. The system of claim 1, wherein the at least three first magnetic sensing elements are anisotropic magnetoresistive sensing elements.

3. The system of claim 1, wherein the at least three first magnetic sensing elements comprise an additional magnetic sensing element positioned on the second substrate plane.

4. The system of claim 1, wherein the computation circuit is configured to determine a coarse position to determine a group of magnetic sensor ICs of the array to use for a fine position measurement, wherein the group comprises the first magnetic sensor IC and the second magnetic sensor IC, and wherein the 3D position information comprises the fine position measurement.

5. The system of claim 4, wherein the computation circuit is configured to determine three-dimensional rotation information for the magnetic target.

6. The system of claim 1, wherein the computation circuit is configured to output three-dimensional rotation information of the magnetic target.

7. The system of claim 1, wherein a column of magnetic sensor ICs of the array includes magnetic sensors ICs that are unevenly spaced from adjacent magnetic sensor ICs in the column.

8. The system of claim 1, wherein a maximum distance between two IC adjacent magnetic sensor ICs of the array that are closest to each other is less than a largest dimension of the magnetic target.

9. The system of claim 1, wherein the computation circuit comprises a microcontroller.

10. The system of claim 9, wherein the computation circuit further comprises an analog-to-digital converter coupled between the magnetic sensor ICs of the array and the microcontroller.

11. A method of determining a position of a magnetic target, the method comprising:
    determining a coarse position of the magnetic target to identify a group of magnetic sensors of an array of magnetic sensors that generate a respective signal that satisfies a threshold;
    measuring a rotation of the magnetic target based on measurements of magnetic sensors of the group of magnetic sensors, wherein magnetic sensors of the array each comprise two magnetic sensing elements on a first substrate and a third magnetic sensing element on a second substrate that is oriented at a non-zero angle relative to the first substrate, the second substrate being different than the first substrate; and
    determining a fine position of the magnetic target based on measurements of magnetic sensors of the group of magnetic sensors.

12. The method of claim 11, further comprising:
    measuring an updated fine position of the magnetic target;
    determining an updated coarse position of the magnetic target; and
    determining an updated rotation of the magnetic target based on the updated fine position.

13. The method of claim 11, further comprising:
    measuring an updated rotation of the magnetic target;
    determining an updated fine position of the magnetic target; and
    determining an updated coarse position of the magnetic target based on the updated rotation of the magnetic target.

14. The method of claim 11, wherein the fine position is a three-dimensional position, and wherein the measuring the rotation comprises measuring rotation of the magnetic target in three-dimensions.

15. An magnetic sensor for detecting a position of a magnetic target, the magnetic sensor comprising:
   a first magnetic sensing element and a second magnetic sensing element positioned on a first substrate plane;
   a third magnetic sensing element and a fourth magnetic sensing element positioned on a second substrate plane oriented at a non-zero angle relative to the first substrate plane, wherein a single integrated circuit includes the first, second, third, and fourth magnetic sensing elements; and
   one or more output contacts of the single integrated circuit configured to provide information from the first, second, third, and fourth magnetic sensing elements indicative of a 3-dimensional (3D) position of the magnetic target.

16. The magnetic sensor of claim 15, further comprising a processing circuit configured to receive data from the first, second, third, and fourth magnetic sensing elements and to calculate an angle of a magnetic field based on the received data.

17. The magnetic sensor of claim 15, wherein the first magnetic sensing element comprises an anisotropic magnetoresistive (AMR) sensing element.

18. The magnetic sensor of claim 15, wherein the first magnetic sensing element comprises magnetoresistive elements arranged in a full bridge configuration.

19. The magnetic sensor of claim 15, wherein the first substrate plane is substantially orthogonal to the second substrate plane.

20. The method of claim 11, wherein each of the two magnetic sensing elements and the third magnetic sensing element is a full bridge anisotropic magnetoresistive (AMR) sensing element.

* * * * *